US011799325B2

(12) United States Patent
Sone et al.

(10) Patent No.: US 11,799,325 B2
(45) Date of Patent: Oct. 24, 2023

(54) POWER TRANSFER DEVICE

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Kosuke Sone, Yokkaichi (JP); Hiroki Hirai, Yokkaichi (JP); Yasuyuki Yamamoto, Yokkaichi (JP); Kota Oda, Yokkaichi (JP); Ichirou Kuwayama, Osaka (JP); Suguru Yamagishi, Osaka (JP); Toyohisa Takano, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 214 days.

(21) Appl. No.: 17/422,378

(22) PCT Filed: Jan. 21, 2020

(86) PCT No.: PCT/JP2020/001844
§ 371 (c)(1),
(2) Date: Jul. 12, 2021

(87) PCT Pub. No.: WO2020/158495
PCT Pub. Date: Aug. 6, 2020

(65) Prior Publication Data
US 2022/0123599 A1 Apr. 21, 2022

(30) Foreign Application Priority Data
Jan. 31, 2019 (JP) .................................. 2019-016141

(51) Int. Cl.
H02J 50/20 (2016.01)
H02J 50/40 (2016.01)
(Continued)

(52) U.S. Cl.
CPC ............ *H02J 50/20* (2016.02); *H02J 7/0044* (2013.01); *H02J 50/40* (2016.02); *H02J 50/70* (2016.02);
(Continued)

(58) Field of Classification Search
CPC ............. B60R 16/03; B60R 2011/0007; B60R 2011/0014; H02J 7/0044; H02J 50/20;
(Continued)

(56) References Cited

U.S. PATENT DOCUMENTS 9,106,107 B2    8/2015  Kanasugi et al.
9,762,081 B2    9/2017  Manova-Elssibony et al.
(Continued)

FOREIGN PATENT DOCUMENTS

JP    110-260215 A    9/1998
JP    2004-007851 A   1/2004
(Continued)

OTHER PUBLICATIONS

Feb. 18, 2020 International Search Report issued in International Patent Application No. PCT/JP2020/001844.

*Primary Examiner* — Levi Gannon
(74) *Attorney, Agent, or Firm* — Oliff PLC

(57) ABSTRACT

A power transfer device disclosed herein is a console installed in a vehicle. The console includes a power transfer panel and a wireless power transfer portion. The power transfer panel outputs microwaves receivable by a built-in power receiver antenna in an electronic device. The wireless power transfer portion in which the power transfer panel is disposed therein can hold the electronic device. A bottom wall, sidewalls, and a cover that define the wireless power transfer portion include microwave shields that shield the microwaves.

13 Claims, 21 Drawing Sheets

(51) Int. Cl.
*H02J 50/70* (2016.01)
*H02J 7/00* (2006.01)
*H05K 9/00* (2006.01)
*B60R 11/00* (2006.01)

(52) U.S. Cl.
CPC .... *H05K 9/0056* (2013.01); *B60R 2011/0007* (2013.01)

(58) Field of Classification Search
CPC .......... H02J 50/23; H02J 50/40; H02J 50/402; H02J 50/70; H05K 9/0056
See application file for complete search history.

(56) References Cited

U.S. PATENT DOCUMENTS

| | | |
|---|---|---|
| 2005/0156560 A1 | 7/2005 | Shimaoka et al. |
| 2009/0303693 A1 | 12/2009 | Mao |
| 2011/0025263 A1* | 2/2011 | Gilbert ................ H02J 50/10 320/108 |
| 2012/0194125 A1 | 8/2012 | Kanasugi et al. |
| 2013/0038279 A1* | 2/2013 | Seyerle ................ B60R 16/033 320/108 |
| 2013/0234660 A1* | 9/2013 | Moriguchi .............. H02J 50/10 320/108 |
| 2014/0354225 A1* | 12/2014 | Kitamura ................ H02J 50/12 320/108 |
| 2015/0171658 A1 | 6/2015 | Manova-Elssibony et al. |
| 2015/0180243 A1* | 6/2015 | Park .......................... H02J 7/02 320/162 |
| 2016/0365745 A1* | 12/2016 | Hyun ...................... H02J 50/10 |

FOREIGN PATENT DOCUMENTS

| | | | |
|---|---|---|---|
| JP | 2012-054369 A | 3/2012 | |
| JP | 2012-178964 A | 9/2012 | |
| JP | 2013-169129 A | 8/2013 | |
| JP | 2015-521459 A | 7/2015 | |
| JP | 2018-121036 A | 8/2018 | |
| WO | WO-2008/022742 A1 * | 2/2008 | ............. H02J 50/70 |

* cited by examiner

POWER TRANSFER DEVICE

TECHNICAL FIELD

The technology disclosed herein relates to a power transfer device that charges an electronic device through wireless power transfer.

BACKGROUND ART

An example of wireless power transfer devices that charge electronic devices such as mobile phones and smartphones through power transfer is disclosed in Japanese Unexamined Patent Application Publication No. 2018-121036 (Patent Document 1). The wireless power transfer device includes a power transmitter coil on a substrate and a power receiver coil on an electronic device. The power transmitter coil and the power receiver coil are opposed to each other without contact. The power is transferred to the electronic device by electrostatic induction between the coils opposed to each other.

RELATED ART DOCUMENT

Patent Document

[Patent Document 1] Japanese Unexamined Patent Application Publication No. 2018-121036

SUMMARY OF THE INVENTION

Problem to be Solved by the Invention

In the power transfer device of this kind, if the power transmitter coil and the power receiver coil are not properly aligned, efficiency in power transfer significantly decreases. A long dimension of the power transmitter coil is set twice a long dimension of the power receiver coil or greater in the power transfer system so that precise alignment between the power transmitter coil and the power receiver coil is not required.

If a space in which the power transmitter coil is to be disposed is limited, the long dimension cannot be increased. Therefore, the efficiency in power transfer may decrease.

This description describes a technology for charging an electronic device through wireless power transfer without alignment.

Means for Solving the Problem

The technology described herein relates to a power transfer device installed in a vehicle. The power transfer device includes a power transfer portion and a holding portion. The power transfer component outputs microwaves receivable by a receiver antenna in at least one electronic device. The holding portion includes walls that define a holding space for holding the at least one electronic device and in which the power transfer component is disposed. The walls include shields to shield the microwaves.

According to the power transfer device, a power receiver in the at least one electronic device receives the microwaves output from the power transfer component. Namely, the at least one electronic device is charged through wireless microwave power transfer. Alignment between a power transmission coil and a power receiver coil is not required during placement of the at least one electronic device, which may be required in an electromagnetic induction method.

Therefore, an increase in size of the power transfer component is not required. The power transfer device can be disposed in a limited space of the vehicle.

The walls of the holding portion include the shields that shield the microwaves. Therefore, the microwaves are less likely to leak out from the holding portion.

The power transfer device disclosed herein may have following configurations.

The walls may include a cover that is pivotable between a closed position to close an opening of the holding portion through which the at least one electronic device is inserted and an open position to uncover the opening. The power transfer device may further include a switching mechanism to switch the power transfer component from off to on when the cover is pivoted to the closed position and from on to off when the cover is pivoted from the closed position to the open position.

According to the configuration, when the cover is pivoted to the closed position, the power transfer component is switched to on by the switching mechanism to automatically start the power transfer to the at least one electronic device. When the cover is pivoted from the closed position to the open position, the power transfer component is switched to off by the switching mechanism to stop the output of the microwaves. Therefore, the microwaves are further less likely to leak out from the holding portion during opening and closing of the cover.

The power transfer device may further include a sealing between an opening edge of the holding portion and the cover so that the sealing is brought in close contact with the hole edge of the holding portion and the cover to shield the microwaves when the cover is at the closed position.

With the sealing between the opening edge of the holding portion and the cover to shield the microwaves, the microwaves are further less likely to leak out between the opening edge of the holding portion and the cover.

The walls may include an upper wall included in an upper section of the holding portion or a lower wall included in a lower section of the holding portion. The power transfer component may be attached to the upper wall or the lower wall.

When the power transfer component is attached to the upper wall or the lower wall and multiple electronic devices are disposed in the holding portion, the microwaves output from the power transfer component are less likely to be blocked by other electronic devices in comparison to a configuration in which the power transfer component is attached to any one of the walls on sides. Therefore, all of the electronic devices are properly charged through the wireless microwave power transfer.

The power transfer device may further include a communication component that establishes wireless communication with the at least one electronic device. The communication component is attached to one of the walls of the holding portion.

When the electronic device that has a wireless communication function is held in the holding portion, the wireless communication may be interrupted by the shields on the walls of the holding portion. In the above configuration, the communication component that establishes the wireless communication with the electronic device is attached to the wall of the holding portion. Therefore, the electronic device is properly charged through the wireless power transfer without losing the wireless communication.

The holding portion may be configured to hold electronic devices. The holding portion may include a stopper to hold the electronic devices unaligned in a traveling direction in which the microwaves output from the power transfer portion travel.

If the electronic devices are arranged in the traveling direction, the microwaves may be absorbed by the electronic device closer to the power transfer component and blocked, an amount of the microwaves to transmitted to the electronic device farther from the power transfer component may be reduced.

According to the above configuration, the electronic devices are not aligned in the traveling direction. Namely, the microwaves output from the power transfer component are less likely to be blocked by other electronic devices and thus the amount of the microwaves transmitted to each electronic device is less likely to be reduced.

The shields may include an artificial magnetic conductor that may reflect incident electromagnetic waves with a phase rotation of 0°.

According to the configuration, with one of the shields formed from the artificial magnetic conductor, the holding portion can be reduced in size without altering distribution of the microwaves in the holding portion.

The shields may be formed from an electromagnetic shielding material that may shield predefined frequencies.

According to the configuration, some of the microwaves are selectively shielded by the shields that may be formed from the electromagnetic shielding material and some of the microwaves used for the wireless communication are passed. Therefore, the wireless communication with the electronic device is less likely to be interrupted while the wireless power transfer to the electronic device is continued.

The power transfer portion may include at least two output portions that may output the microwaves. The power transfer device may further include a phase shifter to control a phase of the microwaves output from at least one of the output portions for increasing an intensity of the microwaves at a specified point. The phase shifter may shift a high intensity point at which the intensity of the microwaves may be higher in a space in the holding portion in which the electronic device may be placeable by controlling the phase of the microwaves.

To increase the intensity of the microwaves in an entire space in the holding portion, the power transfer component may be increased in size. However, if a space for the power transfer component is limited, the microwaves with higher intensity cannot be output to the entire space in the holding portion.

According to the configuration described above, the phase shifter may shift the point at which the intensity of the microwaves is higher in the holding portion. Therefore, the microwaves with the higher intensity can be output to the entire space in the holding portion. According to the configuration, the electronic devices disposed in the holding portion are evenly charged through the wireless power transfer.

The shields may be microwave reflectors that may reflect the microwaves. A microwave concentration area in which the microwaves reflected by the microwave reflector may be concentrated may be formed in the holding portion. The holding portion may include a stand on which the electronic device may be placed in the microwave concentration area.

According to the configuration, when the electronic device is held in the holding portion, the stand brings the electronic device to the microwave concentration area in which the microwaves are concentrated. This configuration improves efficiency in power transfer to the electronic device.

The holding portion may be configured to hold electronic devices. The holding portion may include a stopper to arrange the electronic devices in the microwave concentration area.

According to the configuration, the electronic devices can be arranged in the microwave concentration area in the holding portion with the stopper. This configuration can improve the efficiency in power transfer to each electronic device and the electronic devices can be evenly charged through the wireless power transfer.

The stopper may hold the electronic devices unaligned in a traveling direction in which the microwaves output from the power transfer portion travel.

According to the configuration, the stopper that may arrange the electronic devices may also hold the electronic devices unaligned in the traveling direction.

The holding portion may be included in an armrest, a console, or a door pocket in the vehicle.

A space in the vehicle for the armrest, the console, or the door pocket is limited.

According to the configuration described above, alignment between a power transmitter coil and a power receiver coil during placement of the electronic device.

Therefore, an increase in size of the power transfer component is not required. The application of this configuration to the armrest, the console, or the door pocket is very advantageous.

Advantageous Effects of Invention

According to the technology described herein, power is transferred to an electronic device without wires and alignment.

MODES FOR CARRYING OUT THE INVENTION

First Embodiment

A first embodiment according to the technology described herein will be described with reference to FIGS. 1 to 13.

Figure 1:
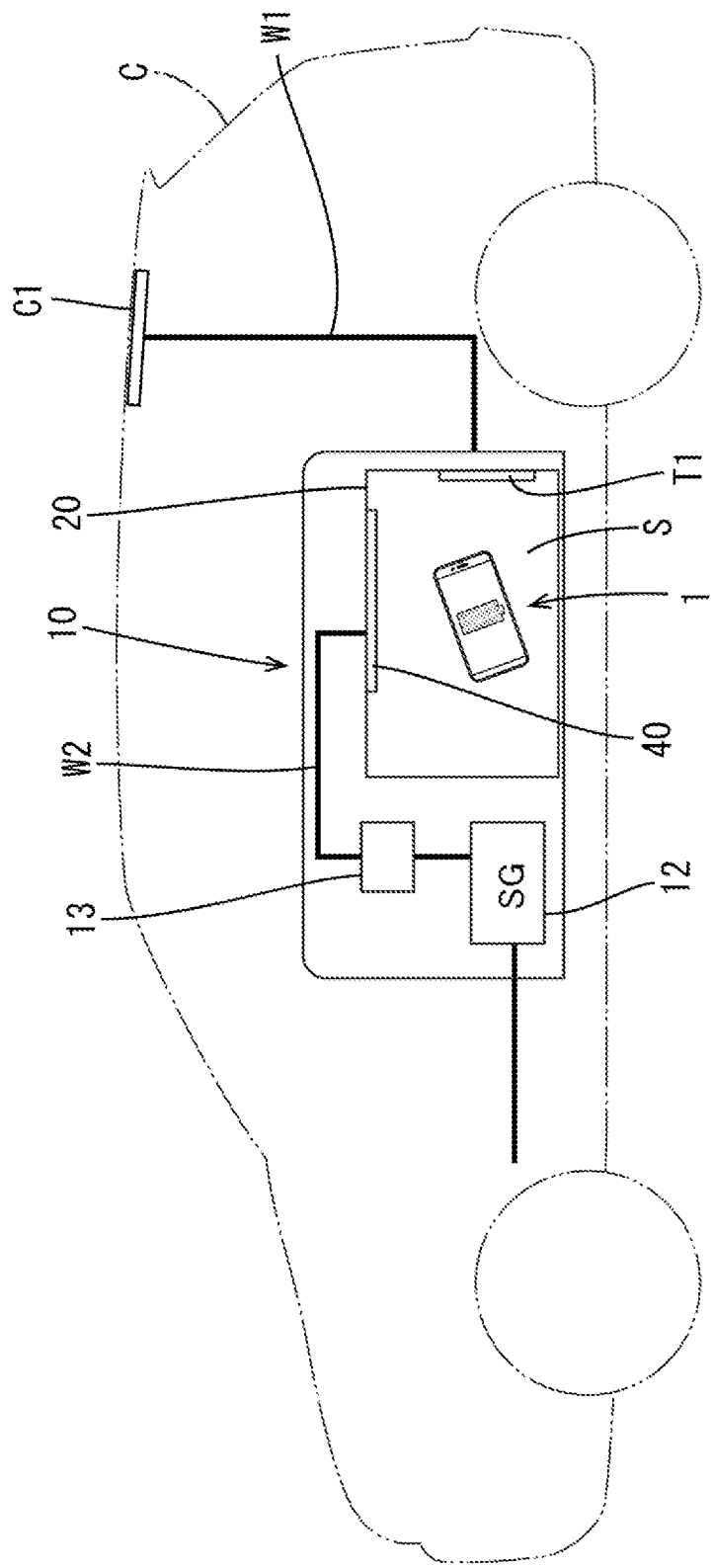
FIG. 1 is a schematic view illustrating a console installed in a vehicle according to the first embodiment.
Figure 2:
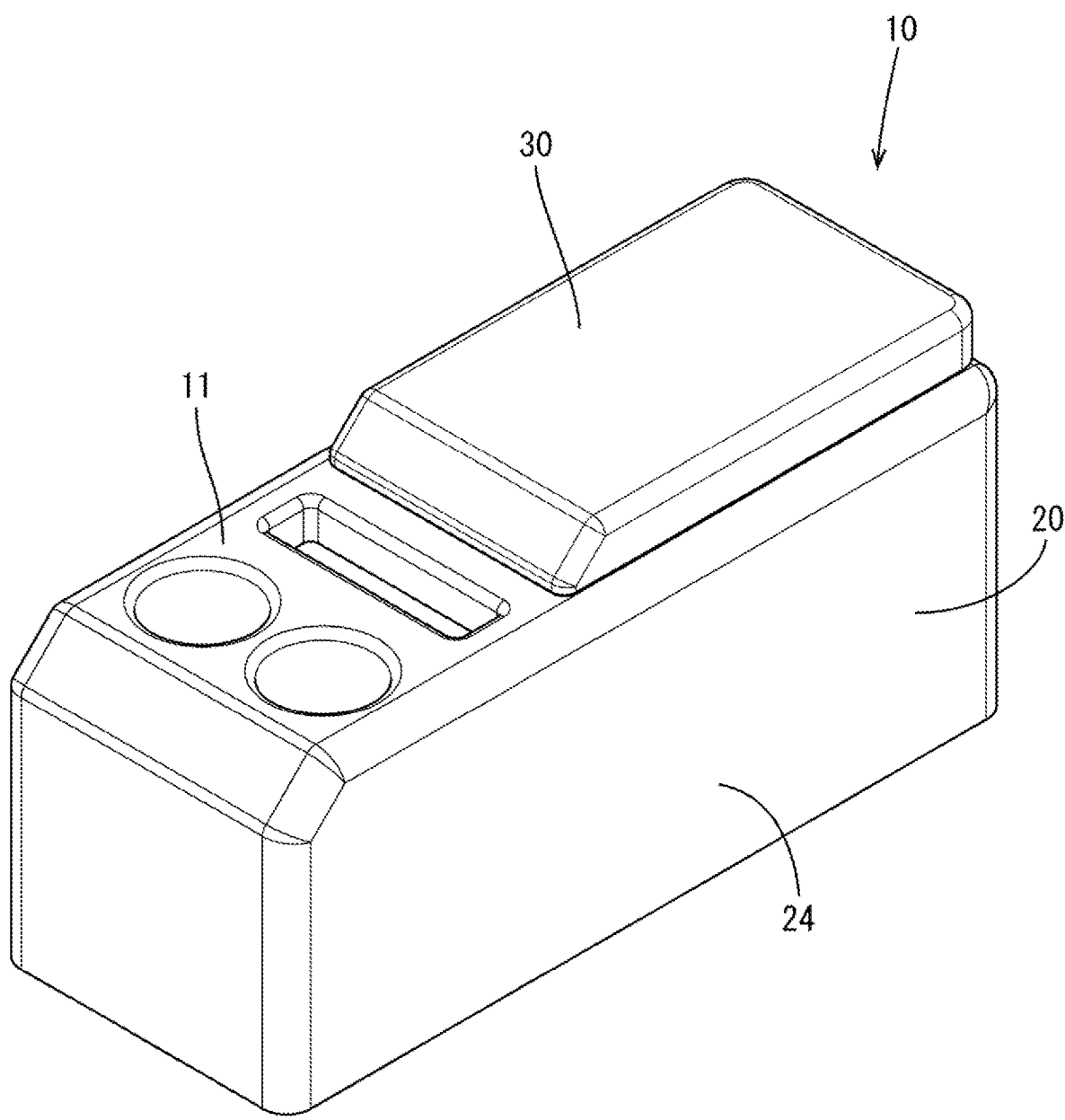
FIG. 2 is a perspective view of the console with a cover at a closed position.
Figure 3:
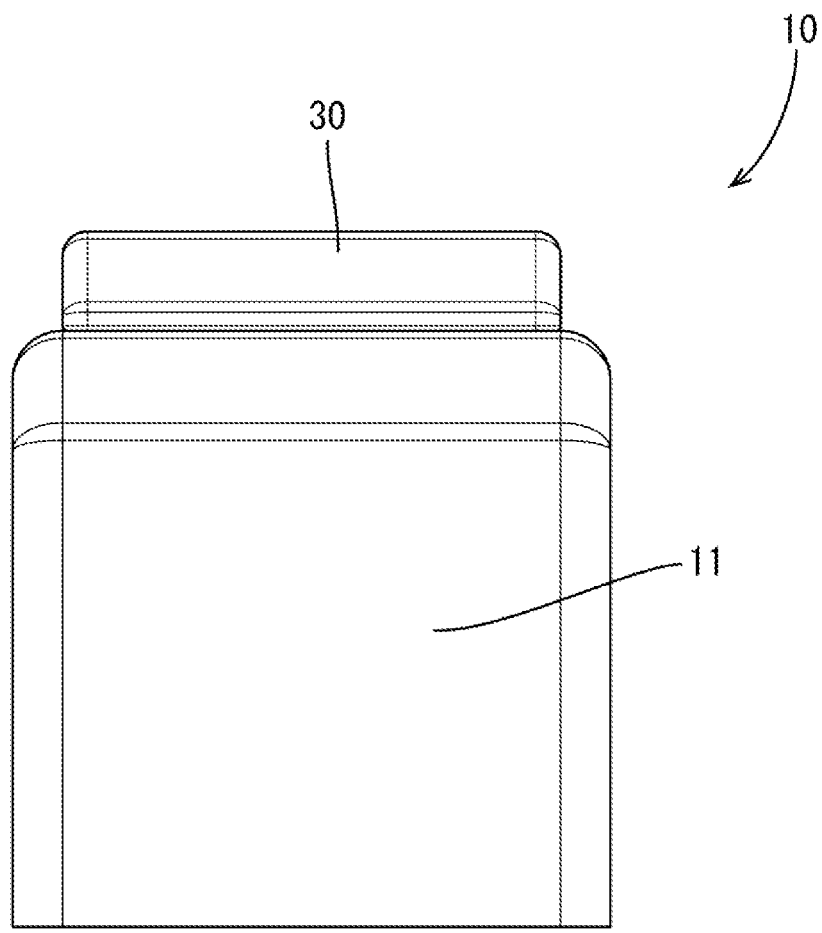
FIG. 3 is an elevation view of the console with the cover at the closed position.
Figure 4:
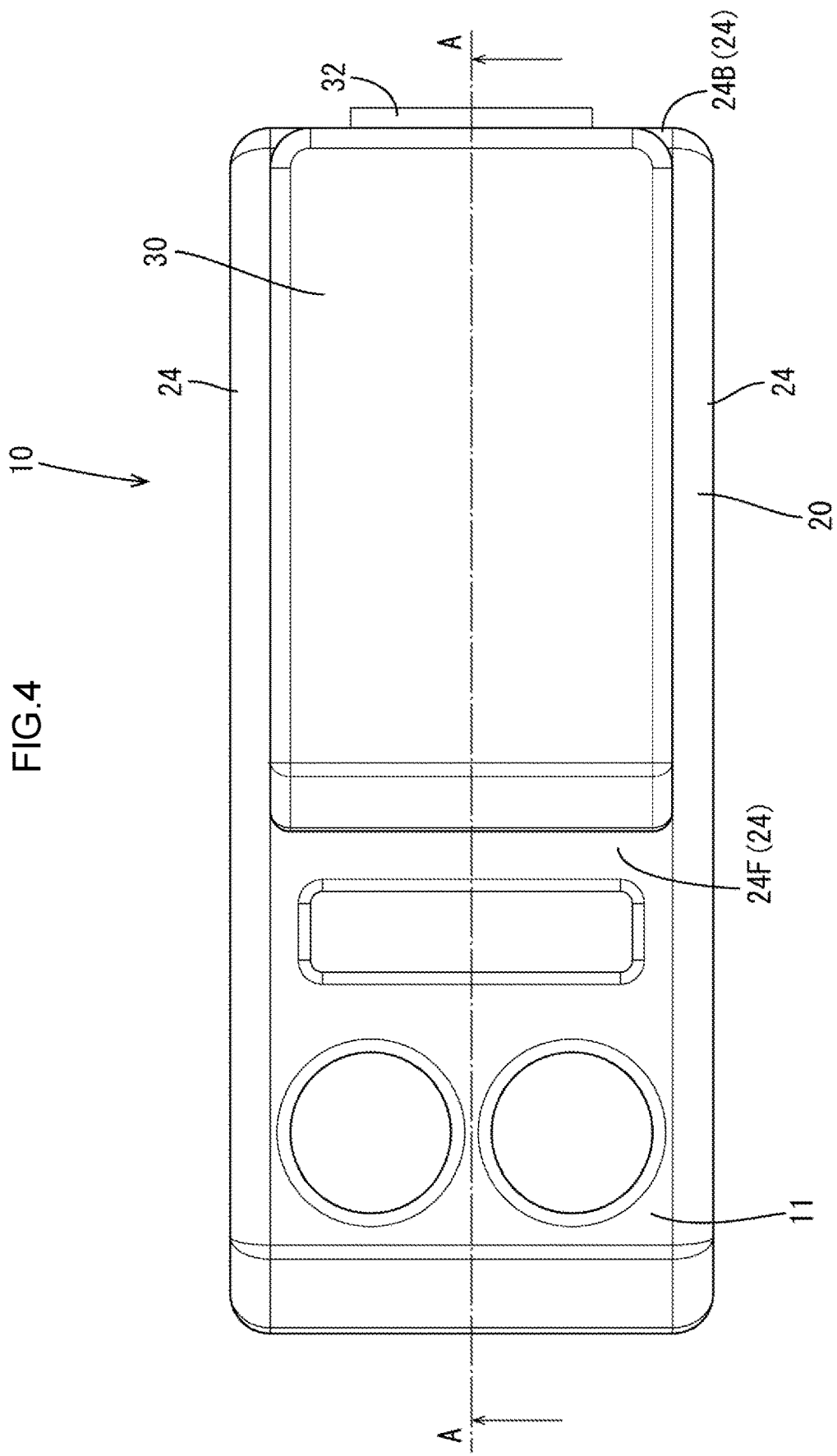
FIG. 4 is a plan view of the console with the cover at the closed position.

This embodiment includes a console 10 (an example of a "power transfer device") installed in a vehicle C. As illustrated in FIG. 1, the console 10 can hold electronic devices 1. In the following description, a vertical direction is defined based on the vertical direction in FIGS. 3 and 5 and a horizontal direction is defined based on the horizontal direction in FIGS. 4 and 5. The horizontal direction is defined based on the vertical direction in FIG. 4. The upper side and the lower side in FIG. 4 are referred to as the right side and the left side, respectively.

The electronic devices 1 may be a smartphone, a tablet personal computer, and a small personal computer. A smartphone will be described as an example of the electronic devices 1.

Figure 13:
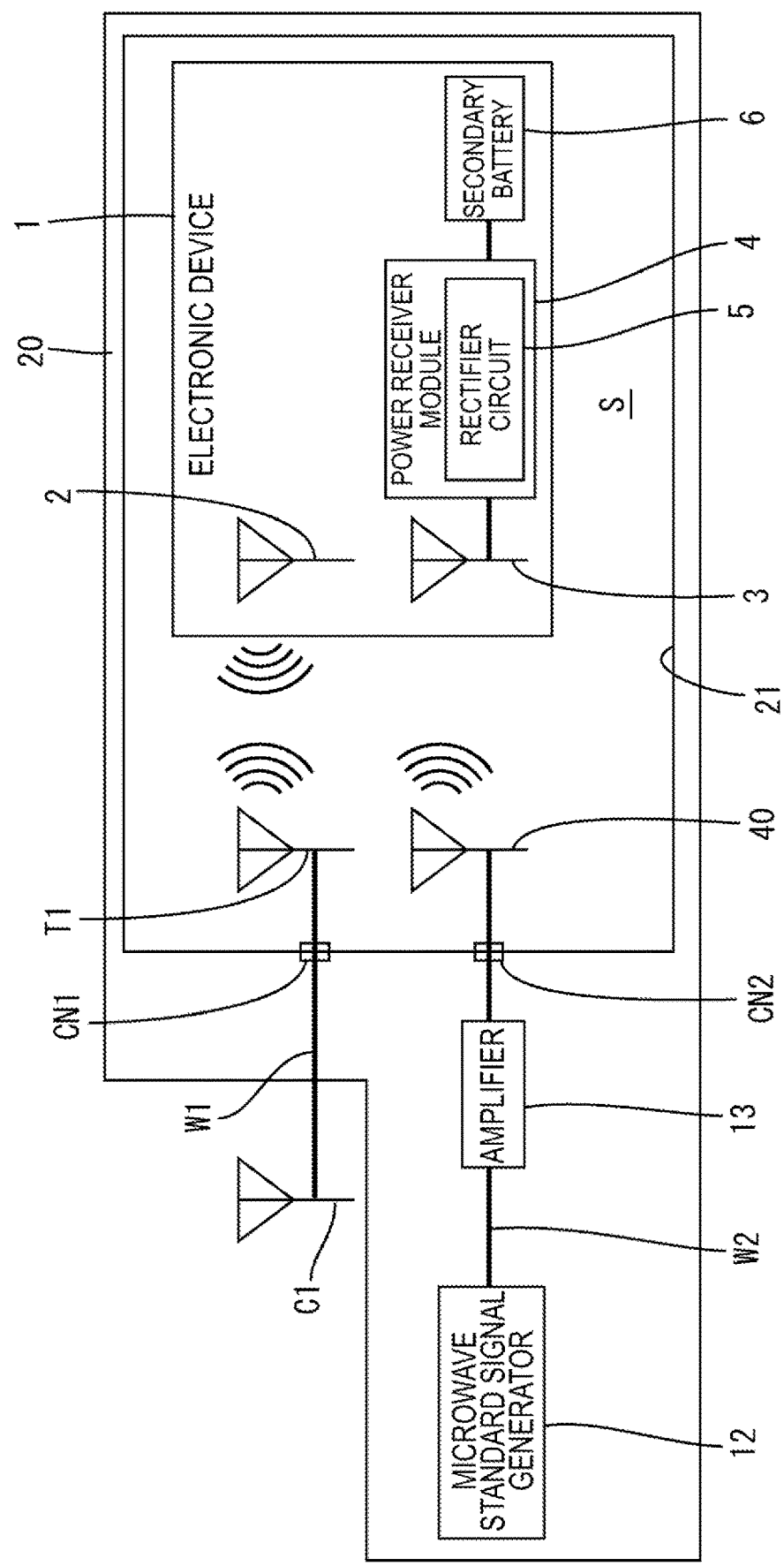
FIG. 13 is a schematic view illustrating an electrical configuration of the console with the cover at the closed position.

As illustrated in FIG. 13, the electronic device 1 includes a built-in communication antenna 2, a built-in power receiver antenna 3 (an example of a "power receiver"), a power receiver module 4, and a secondary battery 6. The built-in communication antenna 2 is for communication. The built-in power receiver antenna 3 receives microwaves. The power receiver module 4 includes a rectifier circuit 5. The secondary battery 6 is connected to the power receiver module 4.

The built-in communication antenna 2 may be an antenna for LET or Wi-Fi. The electronic device 1 performs external communication via the built-in communication antenna 2.

The built-in power receiver antenna 3 receives microwaves. The built-in power receiver antenna 3 is connected to the power receiver module 4. The rectifier circuit 5 in the power receiver module 4 converts the microwaves to direct currents.

The power receiver module 4 is connected to the secondary battery 6. The power receiver module 4 feeds the direct current output from the rectifier circuit 5 to the secondary battery 6.

As illustrated in FIGS. 2 to 6, the console 10 has a rectangular box shape that is elongated in the front-rear direction. The console 10 is disposed between a driver seat and a passenger seat, which are not illustrated, in the vehicle C.

The console 10 includes two cup holders 11 that are recessed from a front portion of the console 10 and have round hole edges in a plan view. The console 10 includes a middle portion and a rear portion that are configured as a wireless power transfer portion 20 (an example of a "holding portion").

The wireless power transfer portion 20 includes a holding recess 21 and a cover 30. The holding recess 21 can hold multiple electronic devices 1. The cover 30 is included in an upper section of the wireless power transfer portion 20 above the holding recess 21. The holding recess 21 and the cover 30 define a holding space S.

As illustrated in FIGS. 7 to 12, the holding recess 21 has an upper opening 22 that has a rectangular shape and opens upward. The holding recess 21 is defined by a bottom wall 23 and four sidewalls 24 (an example of "walls"). The bottom wall 23 has a rectangular shape that is elongated in the front-rear direction. The sidewalls are coupled to edges of the bottom wall 23, respectively.

A depth of the holding recess 21 measuring in the vertical direction is about ⅔ of the height of the console 10 measuring in the vertical direction. A dimension of the holding recess 21 measuring in the horizontal direction is slightly less than a dimension of the console 10 measuring in the horizontal direction.

A communication antenna T1 (an example of a "communication component") connected to an external antenna C1 is attached to a rear wall 24B (a sidewall 24 on the rear side) that defines the holding recess 21.

The communication antenna T1 has a rectangular flat plate shape. The communication antenna T1 is attached to a front inner surface of the rear wall 24B with a double-sided tape, an adhesive, a resin clip, a self-tapping screw, or any other known fixing means. As illustrated in FIG. 13, a communication line W1 is connected to the communication antenna T1. The communication line W1 is connected to the external antenna C1 via a relay connector CN1 that is embedded in the rear wall 24B. The electronic device 1 in the holding recess 21 can wirelessly communicate with the communication antenna T1. The electronic device 1 can communicate with external devices via the communication antenna T1 and the external antenna C1.

As illustrated in FIGS. 7, 8, 10 and 12, the wireless power transfer portion 20 includes a fitting groove 26 around an outer hole edge of the upper opening 22 of the holding recess 21. The fitting groove 26 is recessed downward. The fitting groove 26 has a rectangular frame shape along the upper opening 22. A sealing packing 27 (an example of a "sealing") is fitted in the fitting groove 26. The sealing packing 27 may be made of a mixture of ferrite and synthetic rubber to block the microwaves. The sealing packing 27 has flexibility and a rectangular frame plate shape.

As illustrated in FIGS. 7 to 12, the cover 30 has a rectangular plate shape that is relatively thick and elongated in the front-rear direction. A dimension of the cover 30 in the front-rear direction is slightly greater than a half of the dimension of the console 10 in the front-rear direction. A dimension of the cover 30 in the horizontal direction is slightly greater than a dimension of the holding recess 21 in the horizontal direction.

Figure 5:
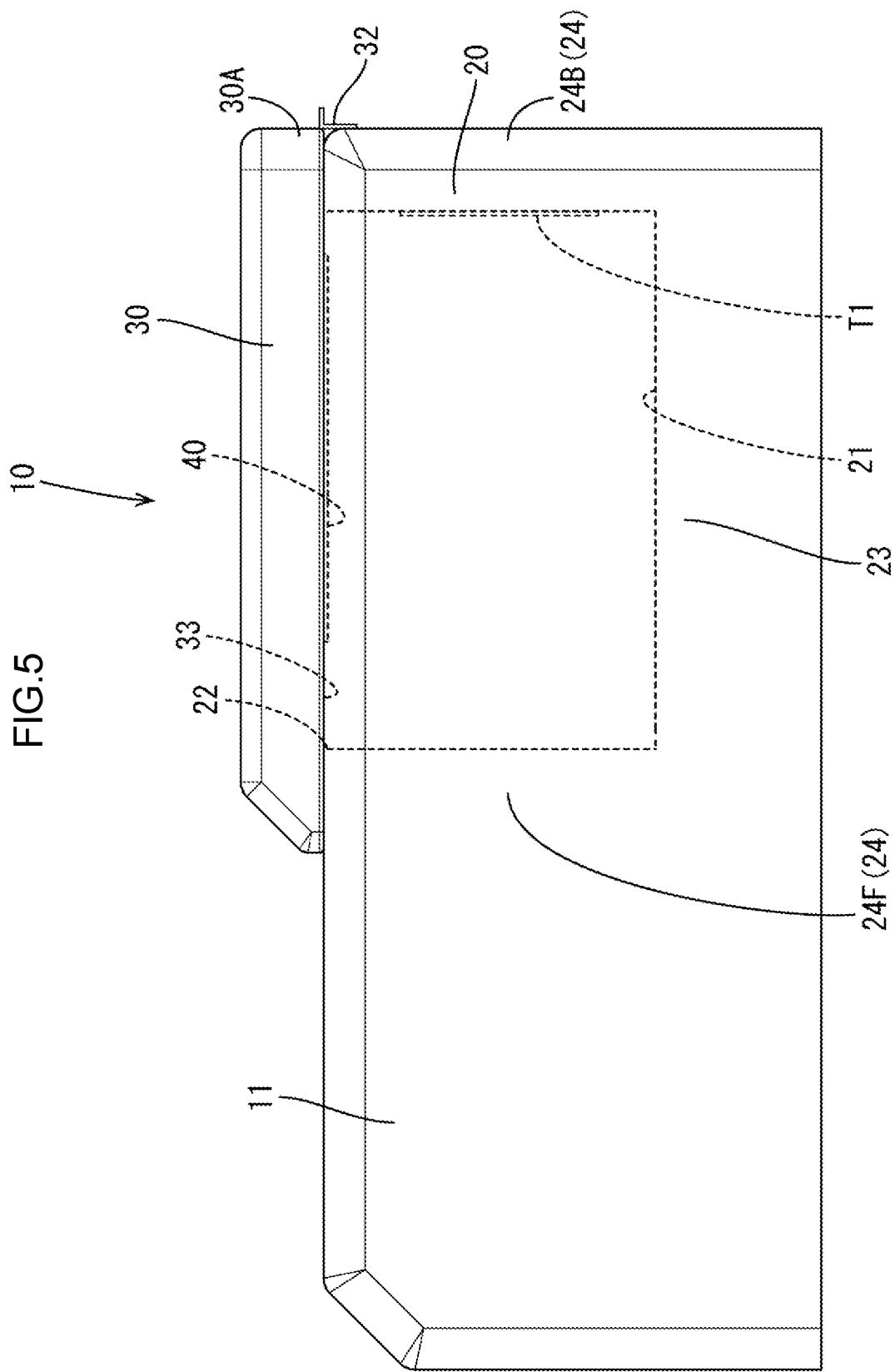
FIG. 5 is a side view of the console with the cover at the closed position.
Figure 6:
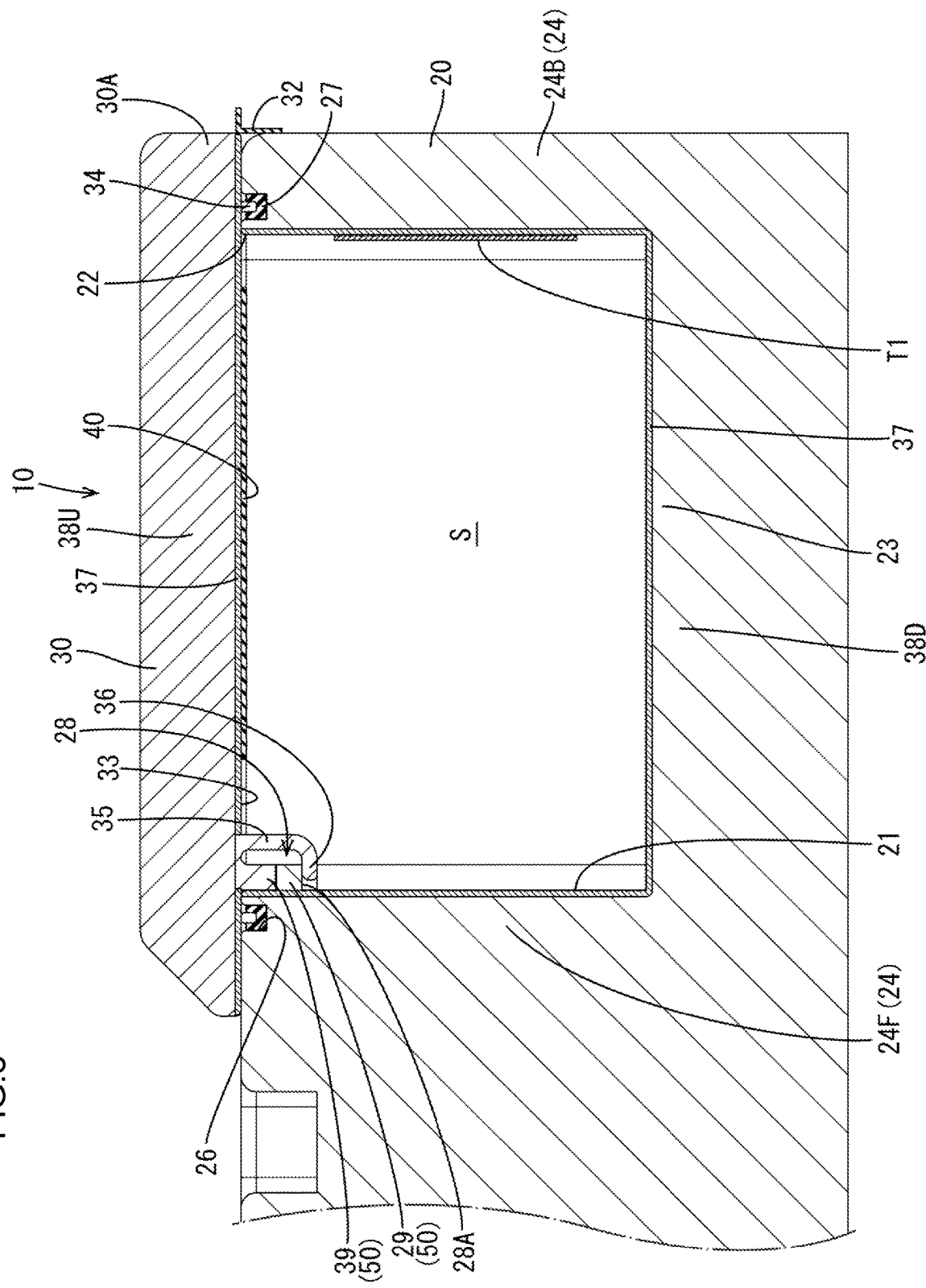
FIG. 6 is a magnified partial cross-sectional view along line A-A in FIG. 4.

When the cover 30 is placed over the holding recess 21, the upper opening 22 of the holding recess 21 is completely covered with the cover 30 from above as illustrated in FIGS. 4 to 6.

The cover 30 is fixed to the rear wall 24B with a hinge 32 that connect a rear portion 30A of the cover 30 to the rear wall 24B that defines the holding recess 21. The cover 30 can pivot on the hinge 32 between a closed position (see FIGS. 5 and 6) and an open position (see FIGS. 10 and 12). At the closed position, the cover 30 is over the holding recess 21 to close the upper opening 22 of the holding recess 21. At the open position, the cover 30 extends upward from the rear wall 24B and thus the upper opening 22 of the holding recess 21 is uncovered.

Figure 7:
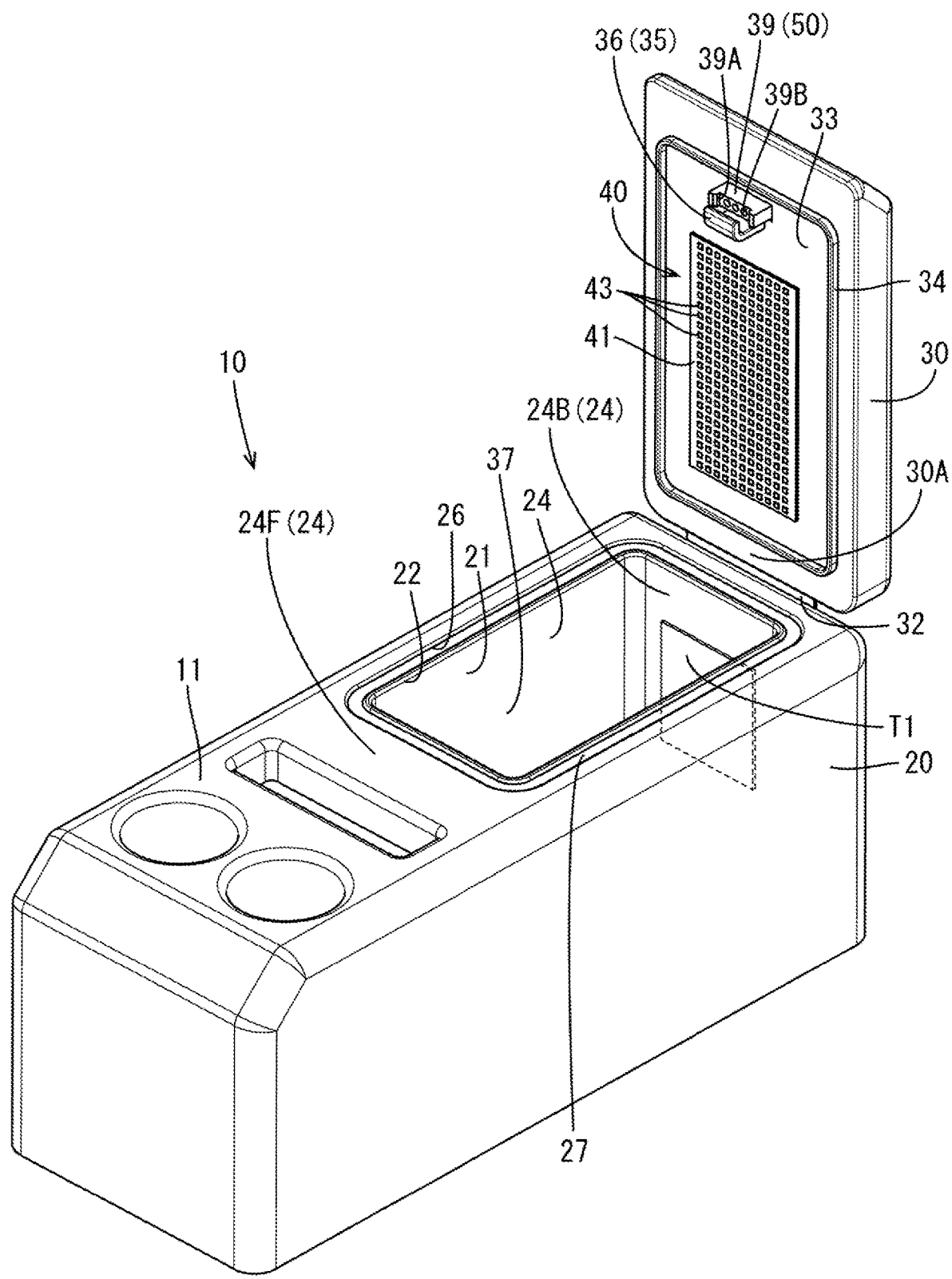
FIG. 7 is a perspective view of the console with the cover at an open position viewed diagonally from the front.
Figure 9:
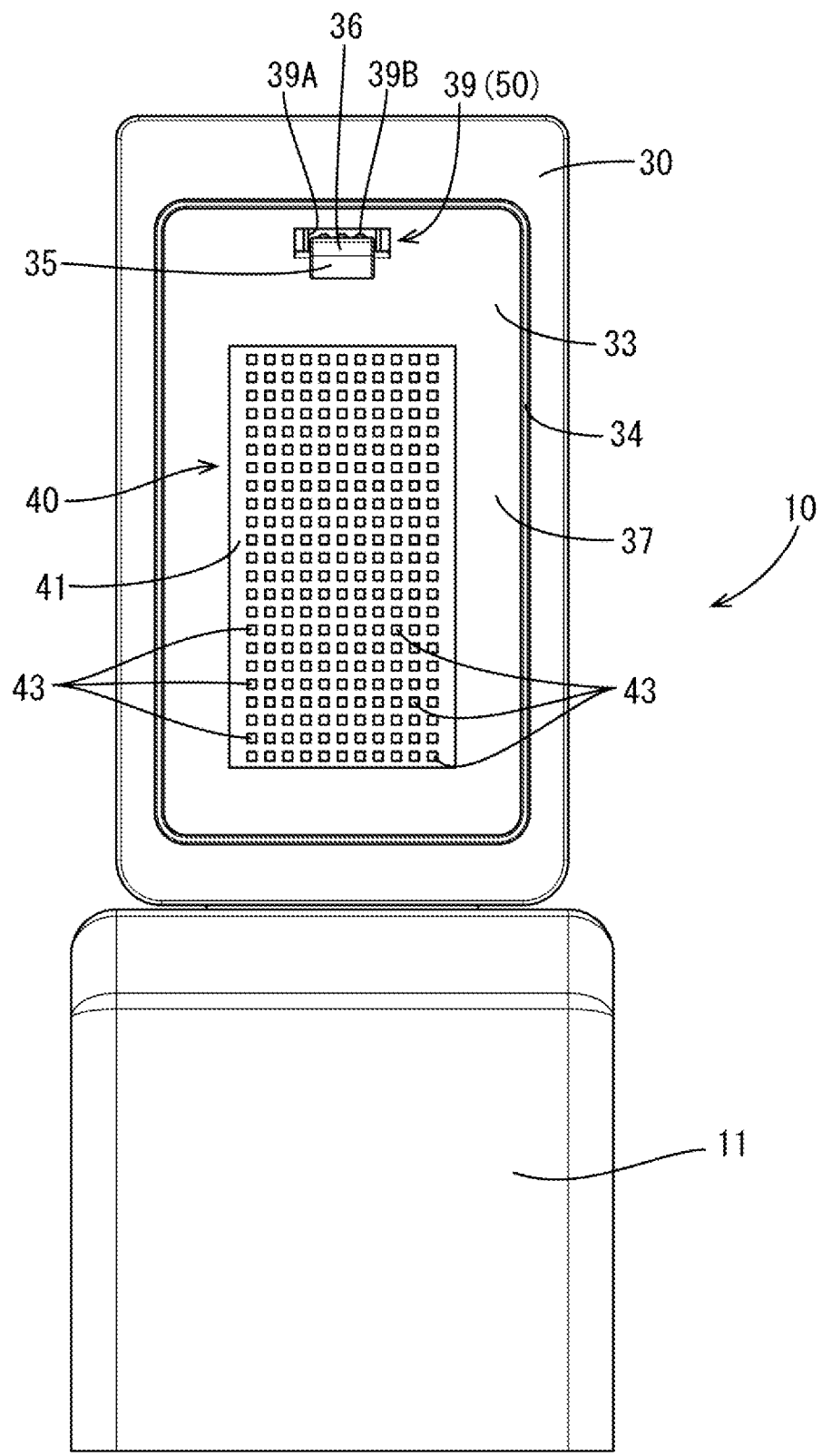
FIG. 9 is an elevation view of the console with the cover at the open position.
Figure 12:
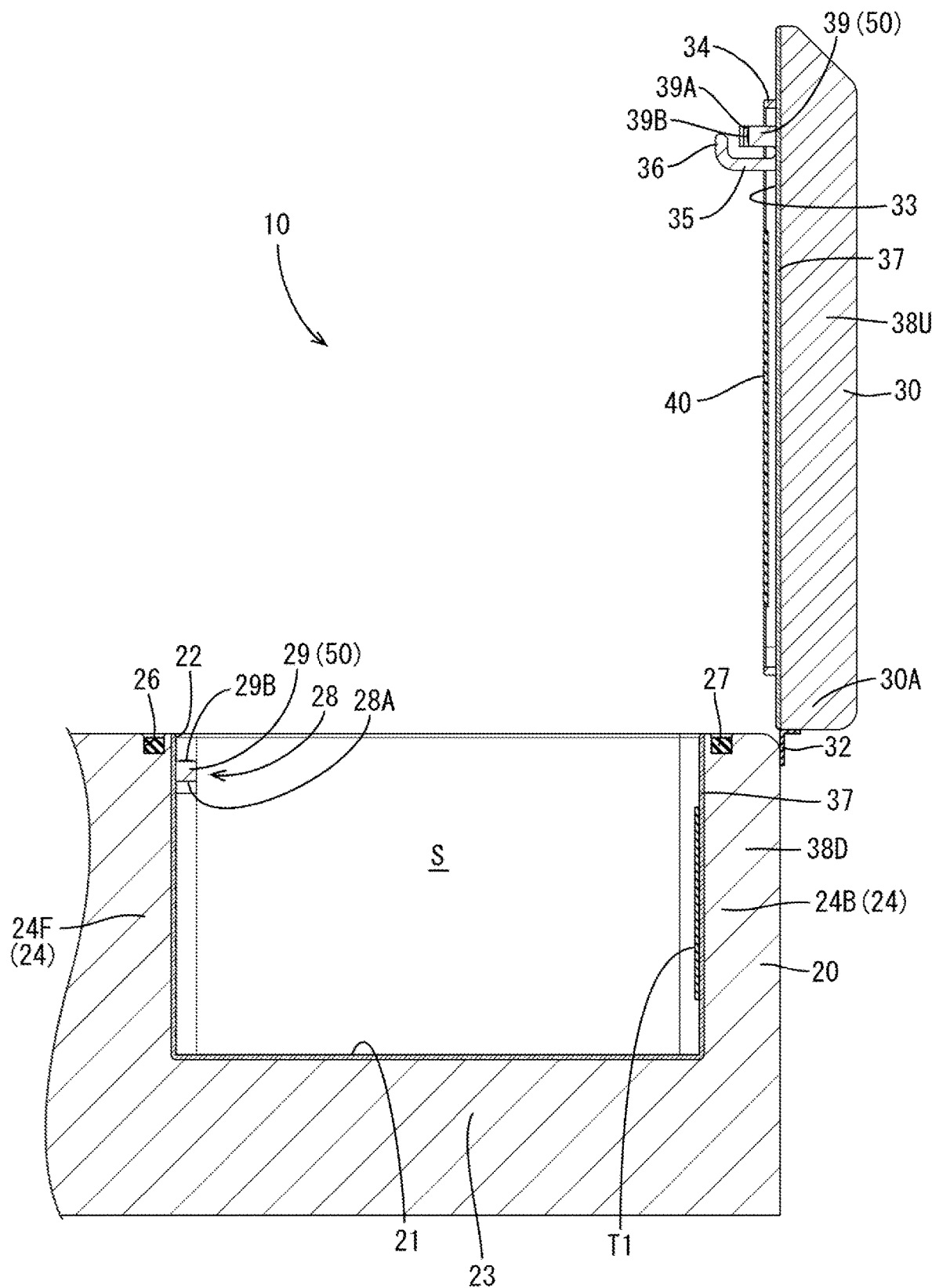
FIG. 12 is a magnified partial cross-sectional view along line B-B in FIG. 10.

As illustrated in FIGS. 7, 9 and 12, the cover 30 includes an inner surface 33 on a holding recess 21 side and a protruding rib 34 on the inner surface 33. The protruding rib 34 has a rectangular frame shape.

The protruding rib 34 protrudes from the inner surface 33 of the cover 30 and extends along an outer edge of the cover 30. When the cover 30 is at the closed position, the protruding rib 34 is inserted in the fitting groove 26 as illustrated in FIG. 6. When the protruding rib 34 is inserted in the fitting groove 26, the protruding rib 34 presses the sealing packing 27 in the fitting groove 26 from above and thus the protruding rib 34 and the sealing packing 27 are in close contact with each other to surround the upper opening 22 of the holding recess 21 for the entire hole edge of the opening 22.

When the cover 30 is at the closed position, the upper opening of the holding recess 21 is covered with the cover 30 and the holding space S defined by the sidewalls 24, the bottom wall 23, and the cover 30 is completely enclosed. Namely, the wireless power transfer portion 20 includes the holding space S that is defined by six walls including four sidewalls 24, the bottom wall 23, and the cover 30.

Figure 8:
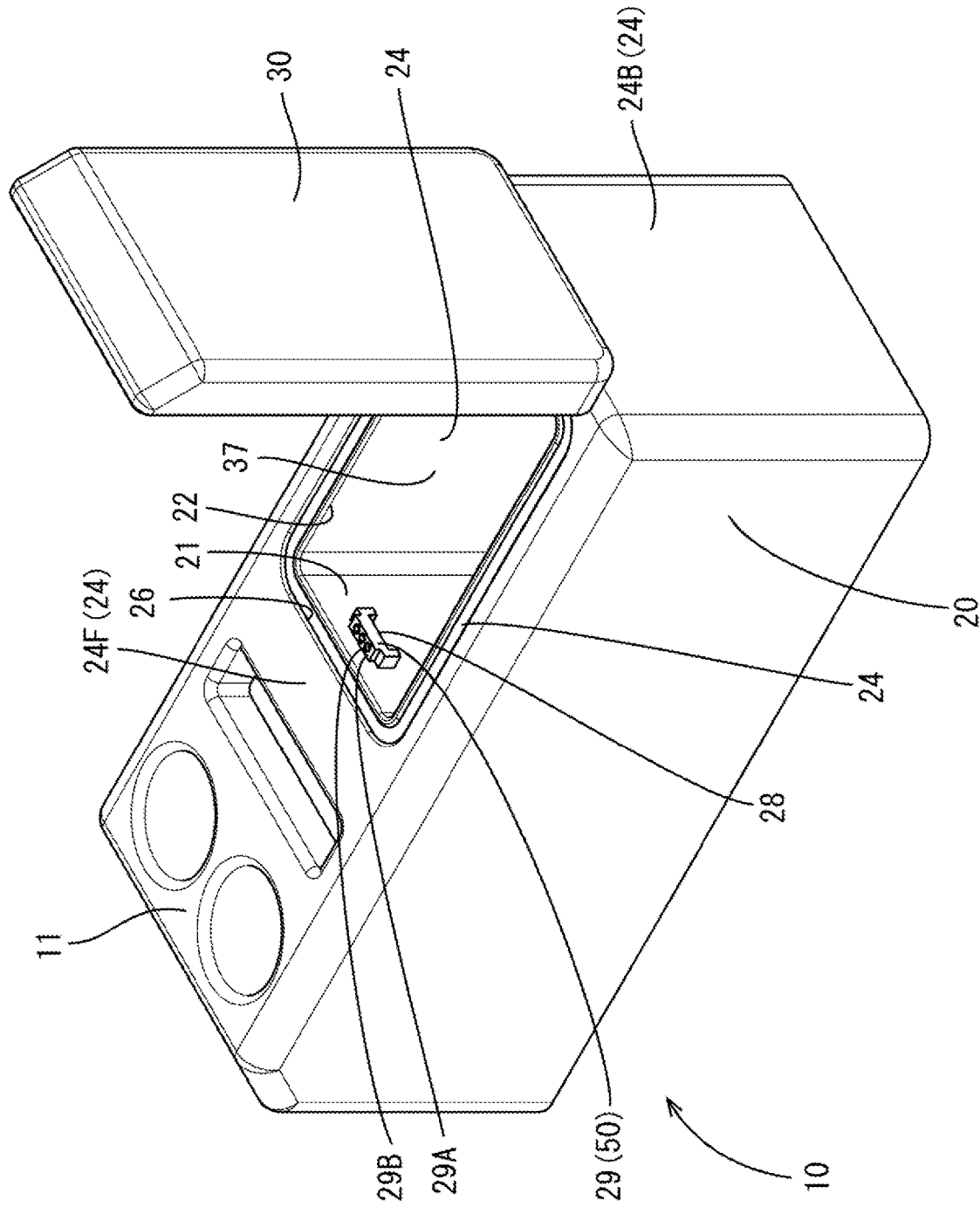
FIG. 8 is a perspective view of the console with the cover at the open position viewed diagonally from the rear.

As illustrated in FIGS. 6 and 7, the cover 30 includes a lock projection 35 at a position inner than the protruding rib 34 on the inner surface 33 (a lower surface) of the front portion of the cover 30. The lock projection 35 can be engaged in a lock receptacle 28 inside the holding recess 21. As illustrated in FIGS. 6 and 8, the lock receptacle 28 inside the holding recess 21 protrudes from the front wall 24F (the sidewall 24 on the front side). The lock receptacle 28 has a block shape that is elongated in the horizontal direction. The lock receptacle 28 includes a lower surface that is defined as an engagement surface 28A.

The lock projection 35 has a plate shape that projects downward from the inner surface 33 of the cover 30. The lock projection 35 has a long dimension in the horizontal direction. The lock projection 35 is elastically deformable in the front-rear direction. The lock projection 35 includes a distal end (a lower end) that bends forward. The distal end is defined as a lock portion 36.

As illustrated in FIGS. 6 and 7, the lock projection 35 elastically deforms rearward when a lock portion 36 runs onto the rear surface of the lock receptacle 28 during pivot of the cover 30 from the open position to the closed position. When the cover 30 reaches the closed position, the lock portion 36 runs over the lock receptacle 28 and returns to its original form. As illustrated in FIG. 6, when the lock portion 36 of the lock projection 35 has run over the lock receptacle 28, the lock portion 36 of the lock projection 35 abuts on a lock surface 28A of the lock receptacle 28 in the vertical direction and thus the cover 30 is held at the closed position. The cover 30 at the closed position can be pivoted from the closed position to the open position by pushing the front portion of the cover 30 upward so that the lock projection 35 elastically deforms rearward and the lock portion 36 is released from the lock surface 28A of the lock receptacle 28.

As illustrated in FIG. 7, a power transfer panel (a "power transfer component") is disposed in an area of the inner surface 33 of the cover 30 inside the protruding rib 34. The power transfer panel 40 outputs the microwaves that the built-in power receiver antenna 3 in the electronic device 1 can receive. As illustrated in FIGS. 6 and 12, the sidewalls 24, the bottom wall 23, and the cover 30 include microwave shields 37 (an example of "shields") to shield the microwaves. The microwave shields 37 are attached to an inner surface (a lower surface) of an upper wall body 38U of the cover 30 and inner surfaces of the sidewalls 24 and a lower wall body 38D of the bottom wall 23, respectively.

The microwave shields 37 may be prepared by forming microwave absorbers or metal plate microwave reflectors into flat plate shapes. The microwave absorbers may be made of a mixture of ferrite and synthetic rubber. The microwave reflectors may be made of aluminum, aluminum alloy, stainless steel, copper, or copper alloy. The microwave shields 37 are attached to entire areas of the inner surfaces of the upper wall body 38U and the lower wall body 38D with adhesives, double-sided tapes, resin clips, or other known fixing means.

The inner surfaces of the walls that define the holding recess 21 and the cover 30 are covered with the microwave shields 37. As illustrated in FIG. 6, when the cover 30 is at the closed position, the holding space S is completely covered with six microwave shields 37 and the sealing packing 27 and enclosed so that the microwaves do not leak out from the wireless power transfer portion 20 to the outside.

As illustrated in FIGS. 7 and 9, the power transfer panel 40 includes a panel body 41 and antenna elements 43. The panel body 41 has a rectangular flat plate shape. The antenna elements 43 are attached to a surface of the panel body 41. An output line W2 is connected to a back surface of the panel body 41. The output line W2 is connected to each antenna element 43.

The antenna elements 43 output the microwaves. The microwaves have frequencies in a range from 0.1 GHz to 100 GHz. The antenna elements in this embodiment output the microwaves with a frequency range from 2.40 GHz to 2.45 GHz.

When all the antenna elements 43 attached to the panel body 41 output the microwaves, the microwaves radiate throughout the holding space S.

As illustrated in FIGS. 7 to 10, on/off of output of the microwaves from the antenna elements 43 is controlled by a switching mechanism 50 including components on the cover 30 and the lock receptacle 28 in the holding recess 21.

The components of the switching mechanism 50 include a concave connector 39 and a convex connector 29. The concave connector 39 is on the inner surface 33 of the cover 30. The convex connector 29 is on the lock receptacle 28 to be engaged in the concave connector 39.

As illustrated in FIGS. 7 and 9, the concave connector 39 protrudes downward from the inner surface 33 of the cover 30 when the cover 30 is at the closed position. The concave connector 39 includes an engagement recess 39A in a lower end of the concave connector 39. The convex connector 29 can be engaged in the engagement recess 39A. Cover-side contacts 39B are arranged in the horizontal direction on a bottom surface of the engagement recess 39A.

Figure 10:
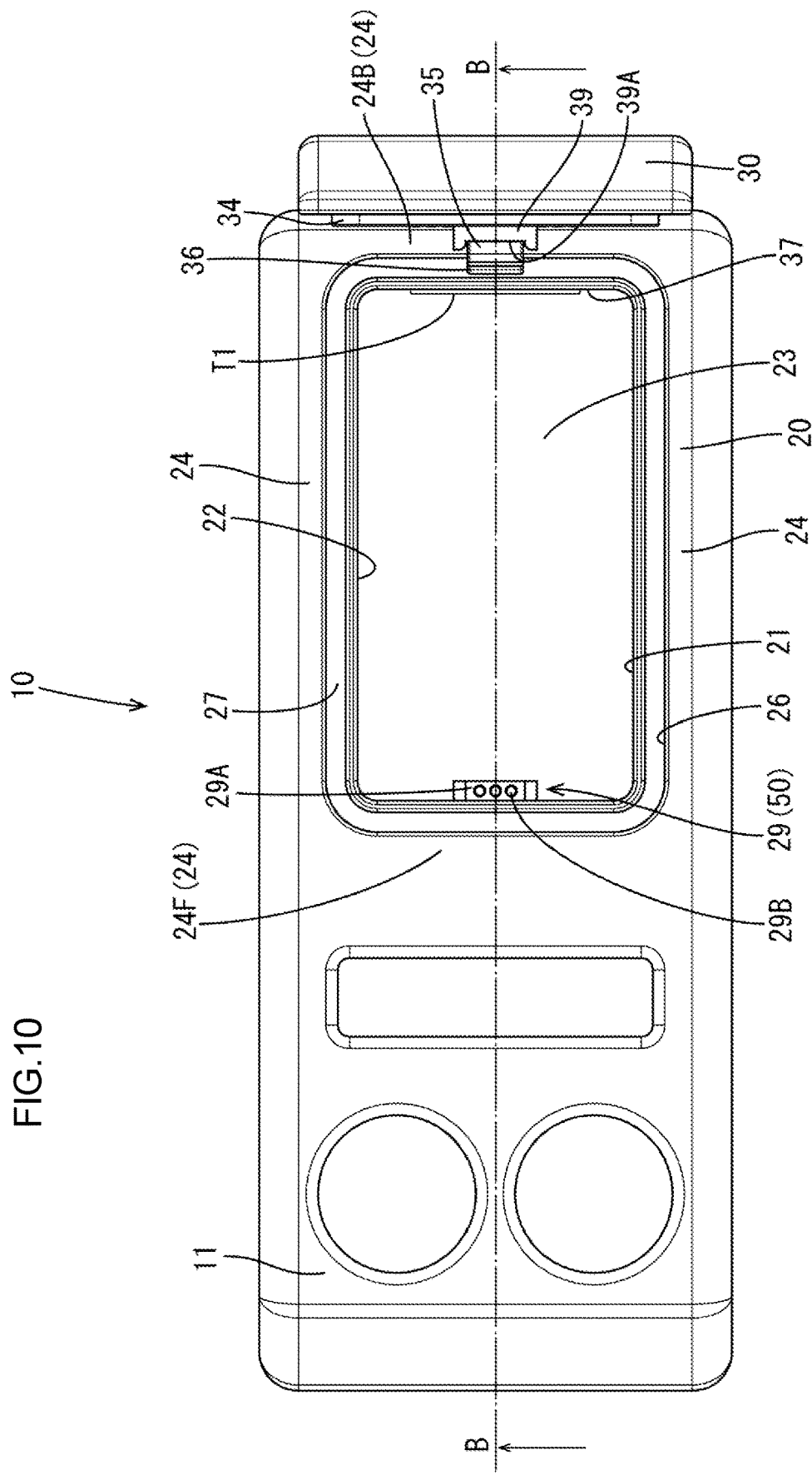
FIG. 10 is a plan view of the console with the cover at the open position.
Figure 11:
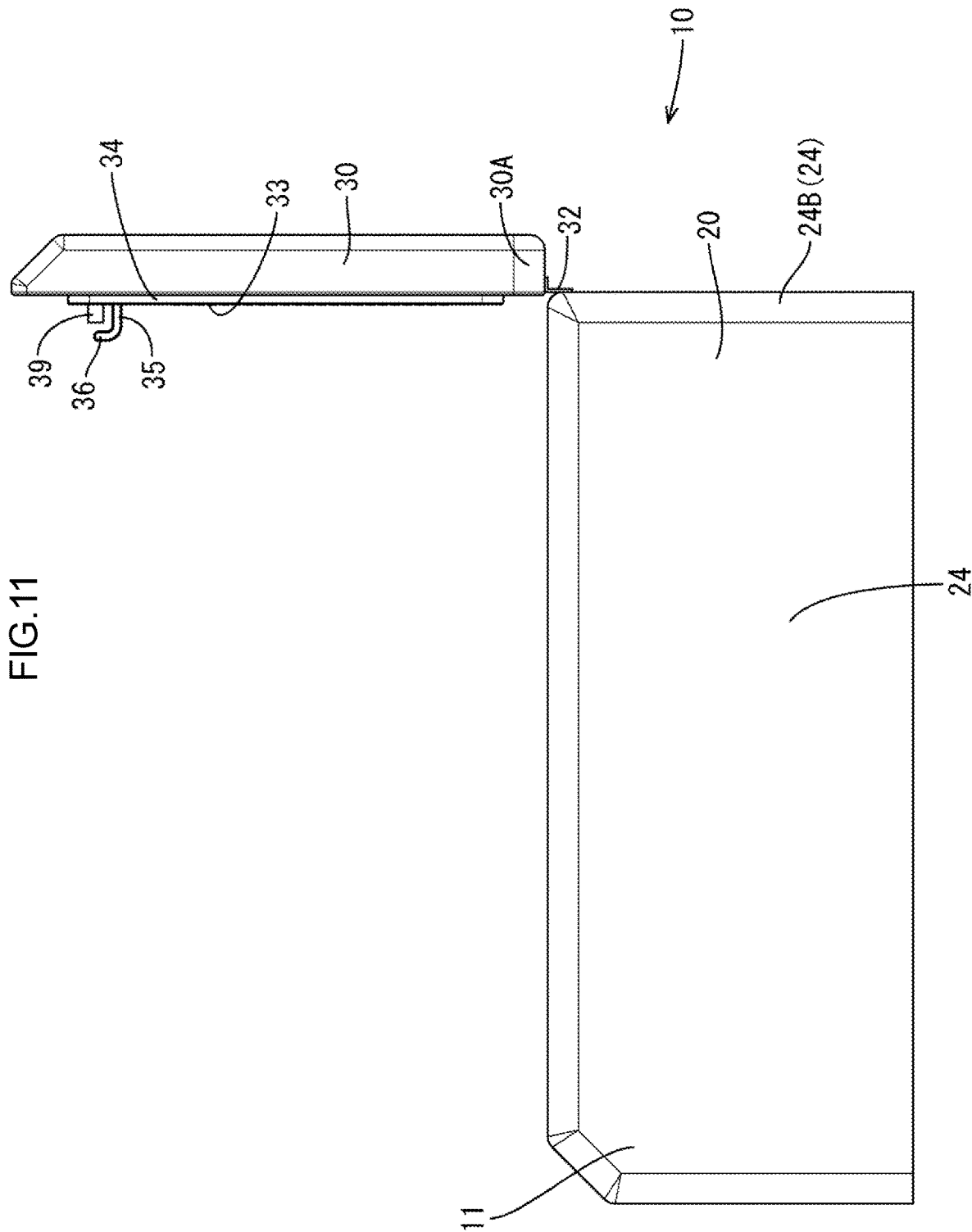
FIG. 11 is a side view of the console with the cover at the open position.

As illustrated in FIGS. 8 and 10, the convex connector 29 on the lock receptacle 28 protrudes from an upper portion of the lock receptacle 28. Receptacle-side contacts 29B are arranged in the horizontal direction on an upper surface 29A of the convex connector 29, which is a distal end surface of the convex connector 29. The receptacle-side contacts 29B correspond to the cover-side contacts 39B of the concave connector 39.

As illustrated in FIG. 6, when the cover 30 is at the closed position, the convex connector 29 is engaged in the concave connector 39. When the convex connector 29 is engaged in the concave connector 39, the cover-side contacts 39B and the receptacle-side contacts 29B are connected to each other.

When the cover 30 is at the closed position, the convex connector 29 is engaged in the concave connector 39 and the cover-side contacts 39B and the receptacle-side contacts 29B are connected to each other, that is, the switching mechanism 50 enters into an on state. As a result, the power transfer panel 40 turns on and the microwaves are output.

When the cover 30 is pivoted from the closed position to the open position, the convex connector 29 is released from the concave connector 39 and thus the receptacle-side contacts 29B are disconnected from the cover-side contacts 39B. The switching mechanism 50 enters into an off state. As a result, the power transfer panel 40 turns off and the output of the microwaves stops.

Next, the electrical configuration of the console 10 will be described with reference to FIG. 13.

The console 10 includes a microwave standard signal generator 12 and an amplifier 13 in a lower section of the wireless power transfer portion 20. The microwave standard signal generator 12 may be referred to as the SG 12 hereinafter. The SG 12 generates microwave standard signals. The amplifier 13 is connected to the SG 12. The SG 12 is connected to the power transfer panel 40 via the amplifier and the output line W2. The output line W2 connected to the amplifier 13 is routed to the inner surface 33 of the cover 30 via a relay connector CN2 in the cover 30 and connected to the power transfer panel 40.

The electronic device 1 in this embodiment configured to receive the microwaves is held in the holding recess 21 of the wireless power transfer portion 20. When the cover 30 is at the closed position, the electronic device 1 receives the microwaves output from the power transfer panel 40 on the cover 30 and the secondary battery 6 feeds power.

As illustrated in FIGS. 1, 6 and 13, the console (the power transfer device) in this embodiment is to be installed on the vehicle C. The console 10 includes the power transfer panel 40 (the power transfer component) and the wireless power transfer portion 20 (the holding portion). The power transfer panel 40 outputs the microwaves that are receivable by the built-in power receiver antenna 3 (the power receiver) in the electronic device 1. The wireless power transfer portion 20 in which the power transfer panel 40 is disposed can hold the electronic device 1. The bottom wall 23 and the sidewalls 24 (the walls) of the wireless power transfer portion 20 and the cover 30 include the microwave shields 37 (the shield) that shield the microwaves.

According to the console 10 in this embodiment, the built-in power receiver antenna 3 of the electronic device 1 receives the microwaves output from the power transfer panel 40, that is, the electronic device 1 receives power through microwave power transfer.

Namely, this embodiment does not require alignment between the power transmitter coil and the power receiver coil during placement of the electronic device, which may be required in the electromagnetic inductive power transfer. Therefore, an increase in size of the power transfer panel 40 is not required and thus the wireless power transfer portion 20 can be disposed in the limited space in the vehicle C (the space between the driver seat and the passenger seat). Because the bottom wall 23 and the sidewalls 24 (the walls) that define the holding recess 21 in the wireless power transfer portion 20 and the cover 30 include the microwave shields 37 that shield the microwaves, the microwaves are less likely to leak out from the wireless power transfer portion 20 (the holding space S defined by the walls of the holding recess 21 and the cover 30).

The cover 30, which is defined as one of the walls of the wireless power transfer portion 20 is pivotable between the closed position illustrated in FIGS. 5 and 6 and the open position illustrated in FIGS. 10 and 12. At the closed position, the cover 30 covers the upper opening 22 (the opening) through which the electronic device 1 is inserted into the wireless power transfer portion 20. At the open position, the upper opening 22 is uncovered. When the cover is pivoted to the closed position, the switching mechanism 50 switches the power transfer panel 40 (the power transfer component) from off to on. When the cover is pivoted from the closed position to the open position, the switching mechanism 50 switches the power transfer panel 40 from on to off.

In this embodiment, when the cover 30 is pivoted to the closed position, the switching mechanism 50 switches the power transfer panel 40 to on and the microwaves are output from the power transfer panel 40. According to the configuration, the electronic device 1 is automatically charged. When the cover 30 is pivoted from the closed position to the open position, the switching mechanism 50 switches the power transfer panel 40 to off and the output of the microwaves stops. Therefore, the microwaves are less likely to leak out from the wireless power transfer portion 20 during open and close of the cover 30.

In this embodiment, the sealing packing 27 (the sealing) is disposed between the opening edge of the wireless power transfer portion 20 (the holding portion) and the cover 30. The sealing packing 27 is brought into close contact with the hole edge of the wireless power transfer portion 20 and the cover 30 when the cover 30 is at the closed position to shield the microwaves.

Because the sealing packing 27 is disposed between the opening edge of the wireless power transfer portion 20 and the cover 30 to shield the microwaves, the microwaves are less likely to leak out between the opening edge of the wireless power transfer portion 20 and the cover 30.

As illustrated in FIGS. 6 and 7, the power transfer panel 40 (the power transfer component) is attached to the inner surface 33 of the cover 30 (the upper wall) that is included in the upper section of the wireless power transfer portion 20 (the holding portion). In comparison to a configuration in which the wireless power transfer component is attached to one of the sidewalls, which is one of the walls of the wireless power transfer portion 20, the microwaves output from the power transfer panel 40 are less likely to blocked by other electronic devices. Therefore, the microwaves are transmitted to all the electronic devices 1 in the holding space S of the wireless power transfer portion 20 and each electronic device 1 is charged.

This embodiment includes the communication antenna T1 (the communication component) that establishes wireless communication with the electronic device 1. The communication antenna T1 is attached to the inner surface of the rear wall 24B (the wall) of the wireless power transfer portion 20 (the holding portion).

When an electronic device that can perform wireless communication is inserted in the wireless power transfer portion, the wireless communication may be interrupted by the shields on the walls of the wireless power transfer portion. In this embodiment, the communication antenna T1 that is for the wireless communication with the electronic device 1 is in the wireless power transfer portion 20. Therefore, the wireless communication with the electronic device 1 can be properly performed.

The wireless power transfer portion 20 (the holding portion) is included in an armrest or the console 10 in the vehicle C.

A space of the vehicle C for the armrest is limited. The space in the console 10 is also limited for other articles.

The electronic device 1 can be charged through microwave power transfer in this embodiment. Therefore, the alignment between the power transmitter coil and the power receiver coil is not required during placement of the electronic device, which is required in the electromagnetic inductive power transfer. That is, the increase in size of the power transfer component such as the power transfer panel is not required. This embodiment is advantageous for application to the armrest or the console 10.

Second Embodiment

Figure 14:
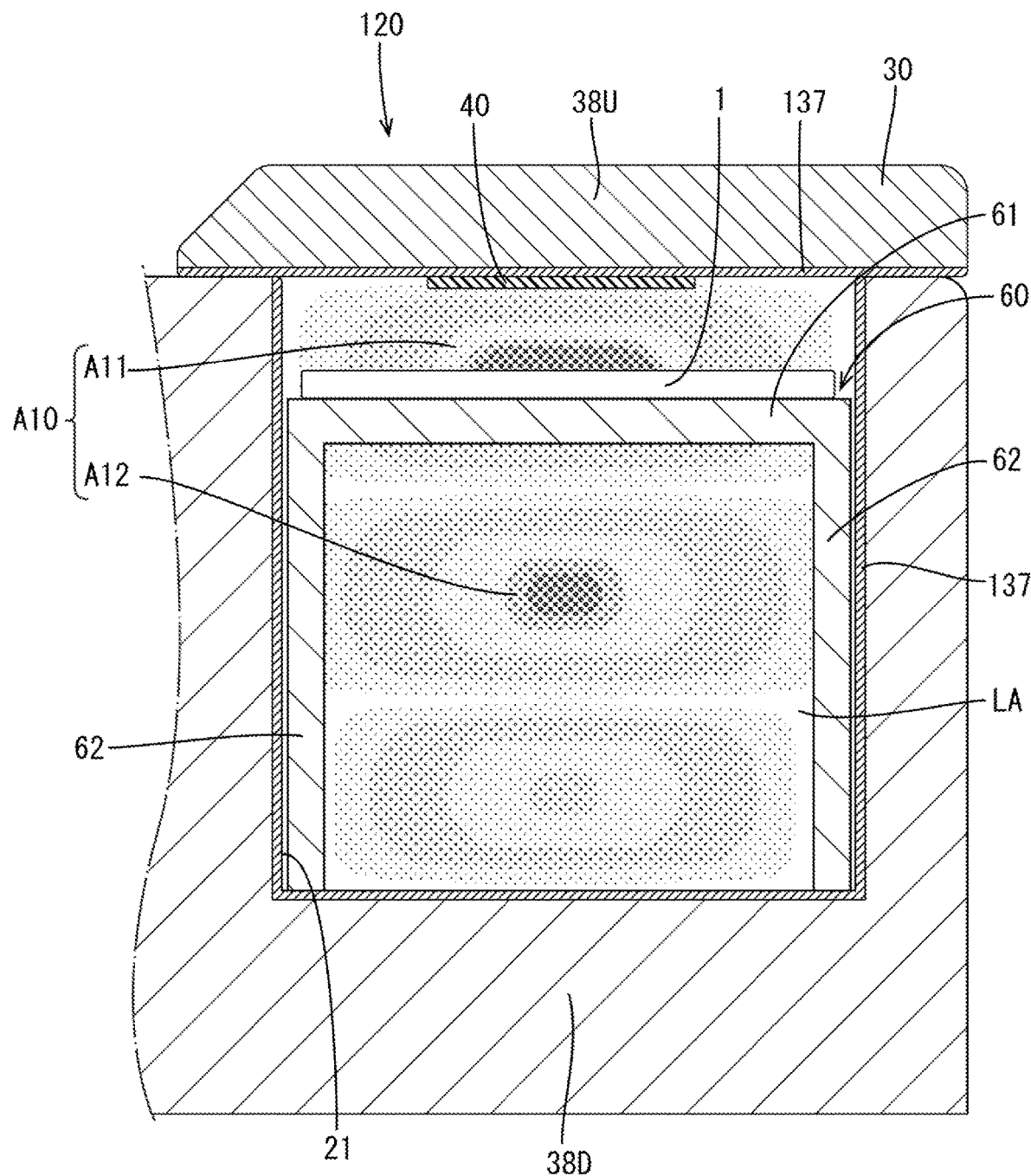
FIG. 14 is a conceptual cross-sectional view illustrating an electronic device placed on a stand in a console according to the second embodiment.

The second embodiment will be described with reference to FIG. 14.

The second embodiment includes microwave reflectors 137 (an example of the "shields") instead of the microwave shields 37 in the wireless power transfer portion 20 in the first embodiment. Configurations, operations, functions, and effect similar to those of the first embodiment will not be described. Components and portions the same as those of the first embodiment will be indicated by reference symbols the same as the reference symbols that indicate the components and the portions of the first embodiment.

The microwave reflectors 137 in a wireless power transfer portion 120 (an example of the "holding portion") in the second embodiment is prepared by processing a metal plate made of aluminum, aluminum alloy, stainless steel, copper, copper alloy, or other metal material. The microwave reflectors 137 are attached to entire areas of the inner surfaces of the upper wall body 38U and lower wall body 38D with adhesives, double-sided tapes, resin clips, or other known fixing means.

A space inside the wireless power transfer portion 120 is surrounded by the microwave reflectors 137 from six directions.

When the cover 30 is at the closed position at which the cover 30 is over the holding recess 21, joints of the microwave reflectors 137 in the holding recess 21 and the microwave reflectors 137 on the cover 30 are continuously in electrical connection. Namely, portions of the microwave reflectors 137 in the holding recess 21 contact portions of the microwave reflectors 137 on the cover 30 and thus the portions of the microwave reflectors 137 in the holding recess 21 are continuously and electrically connected to the portions of the microwave reflectors 137 on the cover 30. The space in the wireless power transfer portion 120 is completely covered with six microwave reflectors 137. According to the configuration, the microwaves are less likely to leak out from the wireless power transfer portions 120.

After the microwaves are output from the power transfer panel 40, the microwaves are reflected by the microwave reflectors 137. In the space in the wireless power transfer portion 120, microwave concentration areas A1 and microwave absent areas LA may be present. The microwaves may be concentrated in the microwave concentration areas A1. The microwaves may be absent in the microwave absent areas LA.

The microwave concentration areas A1 include a higher microwave area A11 and a lower microwave area A12. In the higher microwave area A11, the density of the microwaves is higher. In the lower microwave area A12, the density of the microwaves is lower. In each of the higher microwave area A11 and the lower microwave area A12, the density of the microwaves increases as a distance from the center decreases.

The higher microwave area A11 is slightly below the power transfer panel 40 and the lower microwave area A12 is slightly below the higher microwave area A11. Namely, the density of the microwaves in microwave concentration areas A10 decreases as a distance from the power transfer panel 40 increases.

The microwave absent areas LA are created around the microwave concentration areas A10 due to interference between the reflected microwaves.

A stand 60 includes a holding plate 61 and legs 62. The holding plate has a plate shape. The holding plate 61 is made of synthetic resin and on which the electronic device 1 is placed. The legs 62 extend downward from the holding plate 61. The holding plate 61 in the microwave concentration areas A10 is supported by the legs 62.

Specifically, the holding plate 61 is slightly below the higher microwave area A11 in the microwave concentration areas A10. When the electronic device 1 is placed on the holding plate 61, the electronic device 1 is in the higher microwave area A11.

The microwave reflectors 137 that reflect the microwaves in this embodiment are one type of the microwave shields (the shield). The microwave concentration areas A10 in which the microwaves reflected by the microwave reflectors 137 are concentrated is present in the space in the wireless power transfer portion 120. The wireless power transfer portion 120 includes the stand 60 (the stand) on which the electronic device 1 is placed in the microwave concentration areas A10.

According to this embodiment, when the electronic device 1 is held in the holding recess 21 and the cover 30 is placed over the holding recess 21, the stand 60 brings the electronic device 1 to the higher microwave area A11 of the microwave concentration areas A10 in which the microwaves are concentrated. This configuration improves efficiency in power transfer to the electronic device 1.

Because the stand 60 is disposed in the space in the wireless power transfer portion 120, a space defined by the holding plate 61 and the legs 62 in the wireless power transfer portion 120 can be used for other purposes.

The sealing packing 27 and the switching mechanism 50 in the first embodiment are not included in this embodiment. However, a sealing packing or a switching mechanism may be added to this embodiment where appropriate.

Third Embodiment

Figure 15:
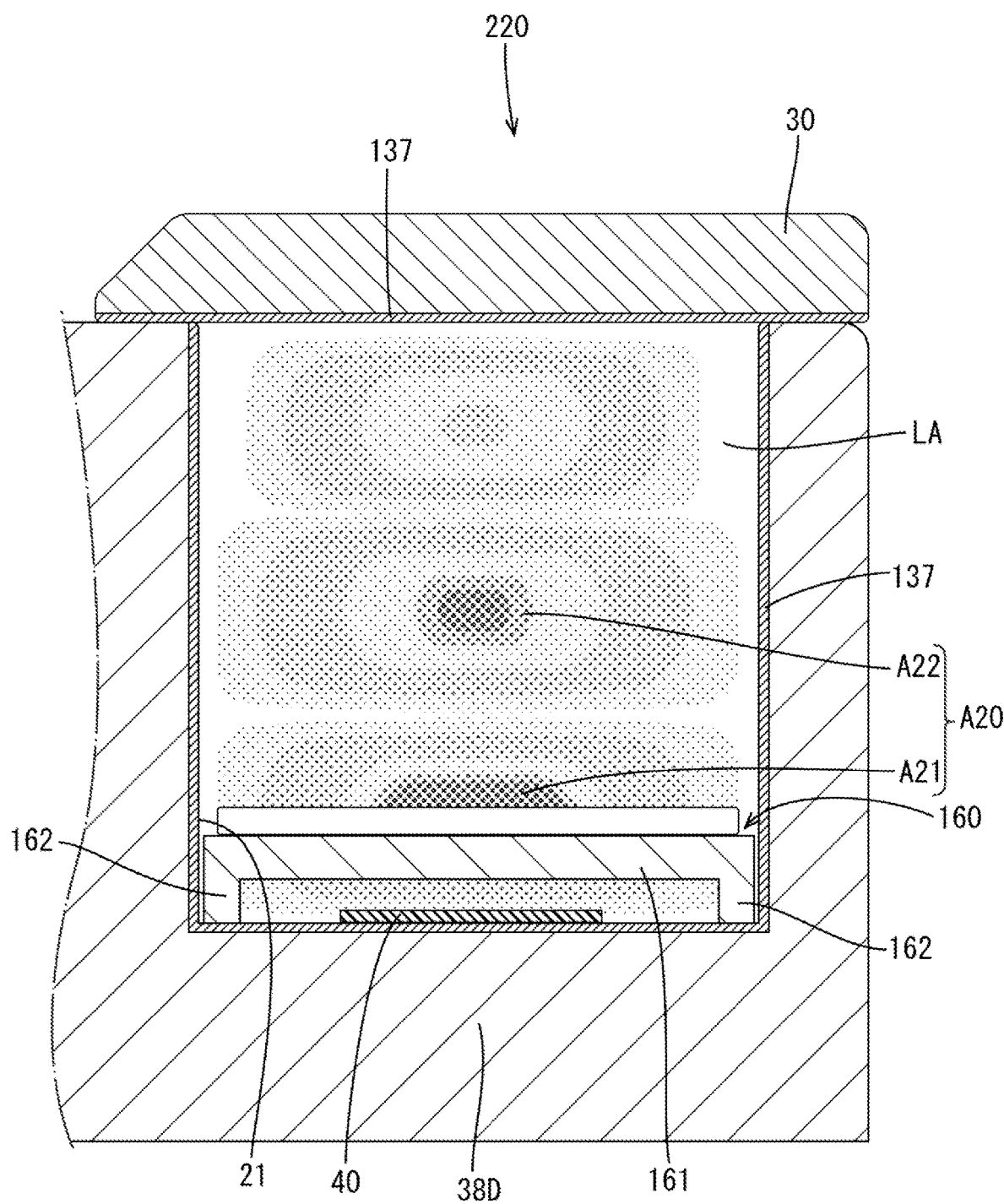
FIG. 15 is a conceptual cross-sectional view illustrating an electronic device placed on a stand in a console according to the third embodiment.

A third embodiment will be described with reference to FIG. 15.

The third embodiment includes a wireless power transfer portion 220 (an example of the "holding portion"). The power transfer panel 40 in the wireless power transfer portion of the second embodiment is attached to the lower wall body 38D. The length of each leg 62 of the stand 60 is reduced. Configurations, operations, functions, and effect similar to those of the first embodiment or the second embodiment will not be described. Components and portions the same as those of the second embodiment will be indicated by reference symbols the same as the reference symbols that indicate the components and the portions of the second embodiment.

The wireless power transfer portion 220 in the third embodiment includes the microwave reflectors 137 that reflect the microwaves that are output from the power transfer panel, similar to the wireless power transfer portion 120 in the second embodiment. When the cover 30 is placed over the holding recess 21, the microwave concentration areas A20 and the microwave absent areas LA may be present. The microwaves may be concentrated in the microwave concentration areas A20. The microwaves may be absent in the microwave absent areas LA.

Because the power transfer panel 40 is attached on the lower wall body 38D in this embodiment, the density of the microwaves in the microwave concentration areas A20 decreases as a distance from the power transfer panel 40 in an upward direction increases. A higher microwave area A21 is slightly above the power transfer panel 40 and a lower microwave area A22 is slightly above the higher microwave area A21.

A stand 160 (an example of the "stand") includes legs 162 each having a smaller length. When the stand 160 is disposed in the holding recess 21, a holding plate 161 of the stand 160 is slightly above the power transfer panel 40 and slightly below the higher microwave area A11 of the microwave concentration areas A10. When the electronic device 1 is placed on the holding plate 161, the electronic device 1 is in the higher microwave area A21.

According to this embodiment, similar to the second embodiment, when the electronic device 1 is in the space in the wireless power transfer portion 220, the stand 160 brings the electronic device 1 to the higher microwave area A21 of the microwave concentration areas A20 in which the microwaves are concentrated. This configuration improves the efficiency in power transfer to the electronic device 1.

The stand 160 and the electronic device 1 are disposed adjacent to the lower wall body 38D in the wireless power transfer portion 220. Therefore, a space in the wireless power transfer portion 220 above a position at which the electronic device 1 is disposed can be used for other purposes.

The sealing packing 27 and the switching mechanism 50 in the first embodiment are not included in this embodiment. However, a sealing packing or a switching mechanism may be added to this embodiment where appropriate.

Fourth Embodiment

A fourth embodiment will be described with reference to FIGS. 16 and 17.

The fourth embodiment includes a wireless power transfer portion 320 (an example of the "holding portion"). In this embodiment, the stand 160 in the wireless power transfer portion 220 in the third embodiment is altered.

Configurations, operations, functions, and effect similar to those of the first embodiment or the third embodiment will not be described. Components and portions the same as those of the first embodiment or the third embodiment will be indicated by reference symbols the same as the reference symbols that indicate the components and the portions of the second embodiment.

Figure 17:
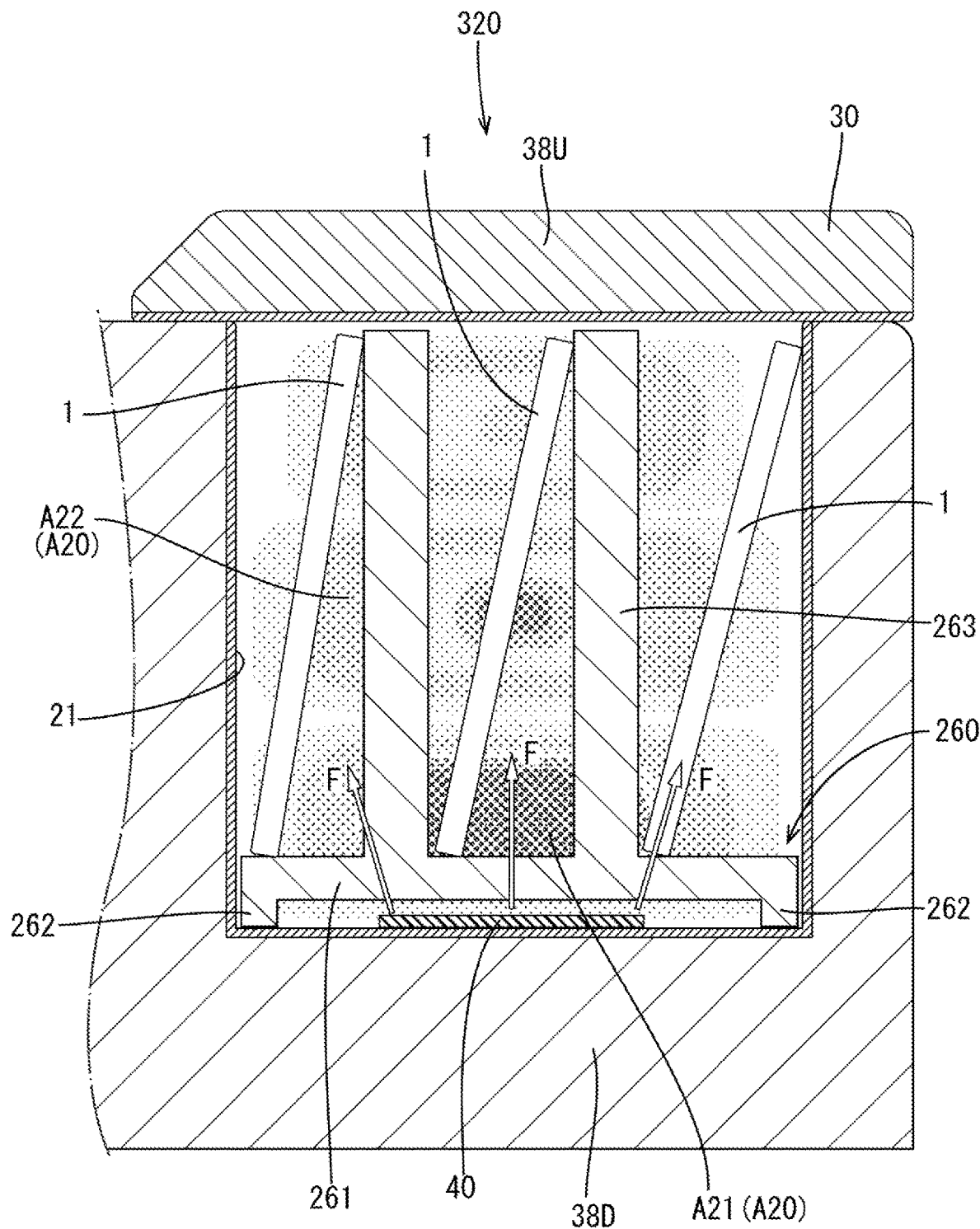
FIG. 17 is a conceptual cross-sectional view illustrating the electronic device placed on the stand in the console

As illustrated in FIG. 17, a stand 260 (an example of the "stand") in the fourth embodiment includes a partition 263 (an example of a "stopper"). The partition 263 projects upward from an upper surface of a holding plate 261.

Figure 16:
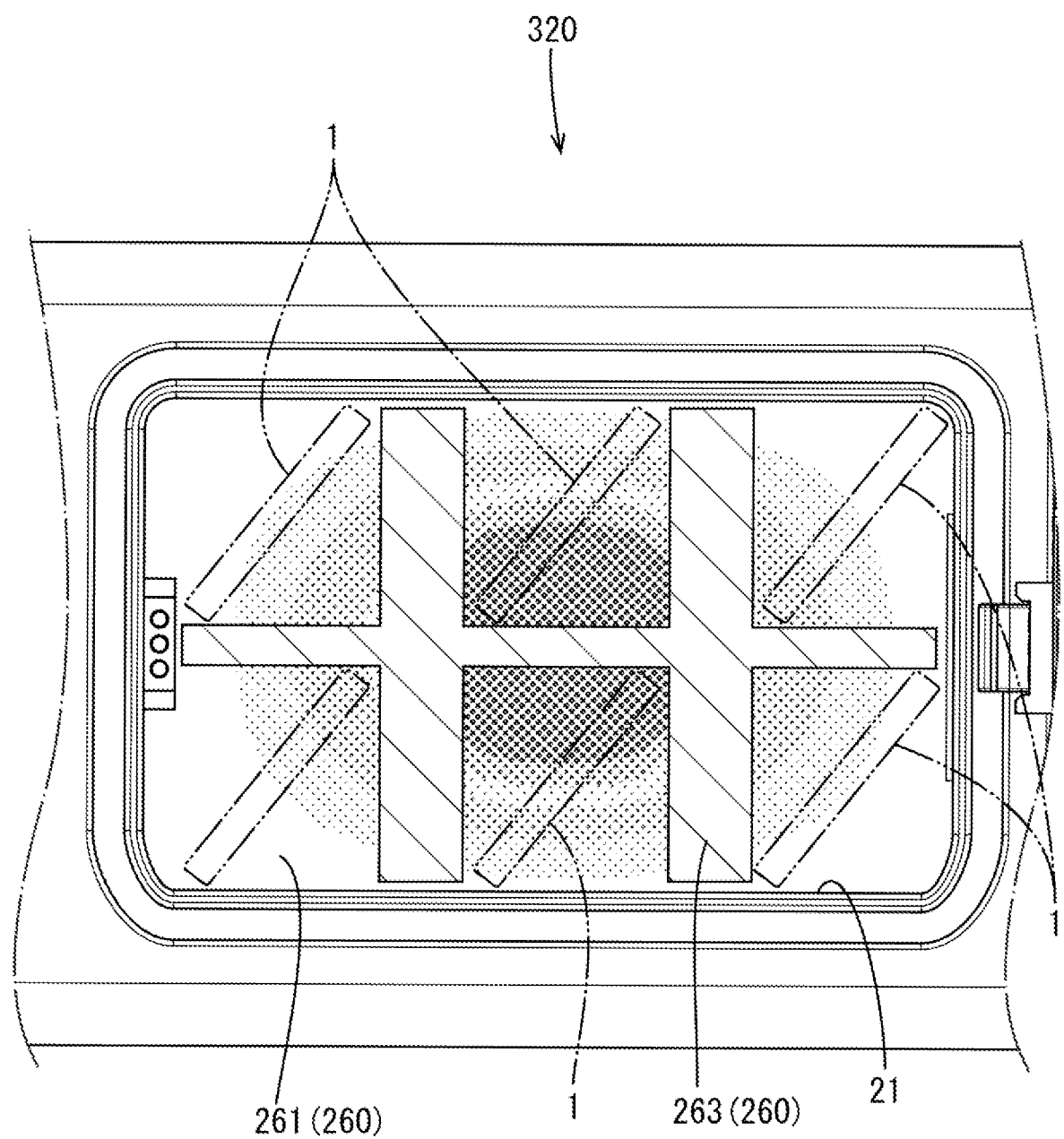
FIG. 16 is a plan view illustrating an electronic device placed on a stand in a console according to the fourth embodiment.

As illustrated in FIG. 16, the partition 263 has a lattice shape to divide a space in the wireless power transfer portion 320 from side to side and from front to rear. As illustrated in FIG. 17, with the partition 263, the electronic devices 1 are less likely to be disposed on top of each other in the vertical direction. As illustrated in FIG. 16, the electronic devices 1 can be disposed side by side and on the front and the rear.

In this embodiment, the electronic devices 1 are arranged in the microwave concentration areas A20 using the partition 263. According to the configuration, the efficiency in power transfer to each electronic device 1 improves and the electronic devices 1 are evenly charged through the wireless power transfer.

In this embodiment, the electronic devices 1 can be arranged so that the electronic devices 1 are not aligned in a microwave traveling direction F in which the microwaves from the power transfer panel 40 travel. If the electronic devices 1 are arranged in a transmission direction in which the microwaves travel, the microwaves may be absorbed by the electronic device 1 closer to a transmission panel. Therefore, the electronic device 1 farther from the transmission panel may receive a less amount of the microwaves.

In this embodiment, the microwaves output from the power transfer panel 40 are less likely to be blocked by other electronic devices 1 and thus each electronic device 1 can receive a proper amount of the microwaves. The electronic devices 1 are arranged in the microwave concentration areas A20 using the partition in this embodiment. When the electronic devices 1 are disposed as described above, a polarizing direction of the antenna element 43 on the power transfer panel 40 automatically matches a polarizing direction of the built-in power receiver antenna 3 in each electronic device 1. Therefore, the efficiency in transfer of the microwaves improves.

The sealing packing 27 and the switching mechanism in the first embodiment are not included in this embodiment. However, a sealing packing or a switching mechanism may be added to this embodiment where appropriate.

Fifth Embodiment

Figure 18:
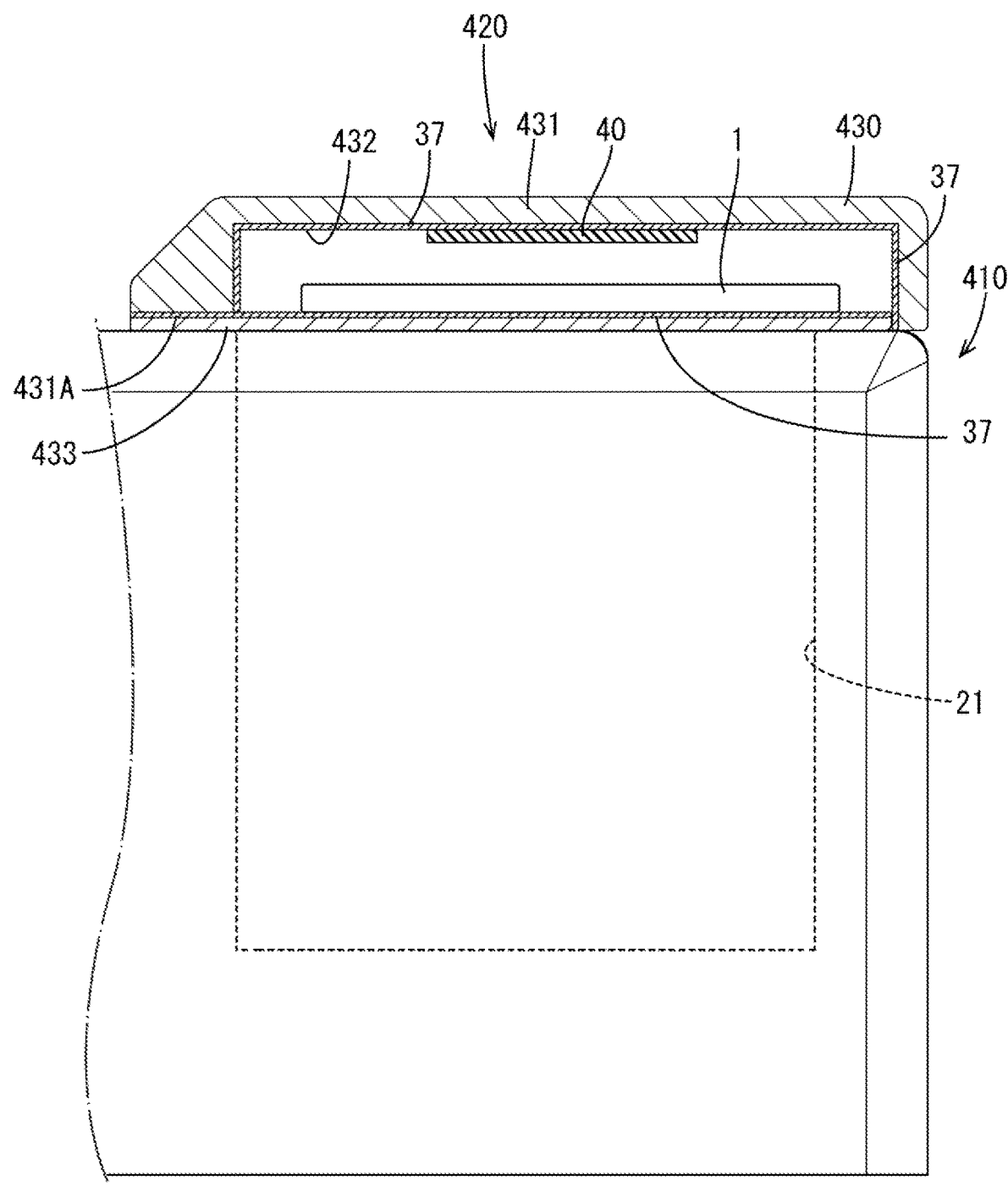
FIG. 18 is a conceptual cross-sectional view illustrating an electronic device disposed on a cover of a console according to the fifth embodiment.

A fifth embodiment will be described with reference to FIG. 18.

The fifth embodiment includes a console 410 (an example of the "power transfer device"). A wireless power transfer portion 420 (an example of the "holding portion") is included in the cover 30 of the console 10 in the first embodiment. Components that are not charged can be held in the holding recess 21. Configurations, operations, functions, and effect similar to those of the first embodiment will not be described. Components and portions the same as those of the first embodiment will be indicated by reference symbols the same as the reference symbols that indicate the components and the portions of the first embodiment.

The fifth embodiment includes a cover 430 on the wireless power transfer portion 420. The cover 430 includes a cover body 431 and a lid 433. The cover body 431 includes a cover-side recess 432 in which the electronic device 1 is held. The lid 433 is attached to a lower surface of the cover body 431 to close the cover-side recess 432.

The cover-side recess 432 is recessed from a lower surface 431A of the cover body 431 with a rectangular opening. The microwave shields 37 used in the first embodiment are attached to inner walls of the cover-side recess 432 with the fixing means similar to that of the first embodiment. The power transfer panel 40 is attached to a surface of the microwave shield 37 attached to an inner surface of the bottom wall of the cover-side recess 432.

The lid 433 has a flat plate shape. The lid 433 is coupled to the cover body 431 with a hinge, which is not illustrated. The hinge is at the rear end of the cover body 431. The microwave shield 37 used in the first embodiment is attached to the upper surface of the lid 433 with the fixing means similar to that of the first embodiment. The electronic device 1 can be placed on a surface of the microwave shield 37 on the lid 433.

When the lid 433 is fixed to the lower surface of the cover body 431 to close the opening of the cover-side recess 432 on the lower side, the electronic device 1 is surrounded by the microwave shields 37 from six directions and held in an space in the wireless power transfer portion 420.

In this embodiment, the holding recess 21 can be used for holding components that are not related to the power transfer. The wireless power transfer portion 420 is included in the cover 430 of the console 410 that is disposed in a limited space of the vehicle C.

The sealing packing 27 and the switching mechanism in the first embodiment are not included in this embodiment. However, a sealing packing or a switching mechanism may be added to this embodiment where appropriate.

When the lid 433 is fixed to the lower surface of the cover body 431 to cover the opening of the cover-side recess 432 on the lower side, joints of the microwave shields 37 on the walls of the cover-side recess 432 and on the lid 433 are continuously in electrical connection. Namely, portions of the microwave shields 37 in the cover-side recess 432 contact a portion of the microwave shields 37 on the lid 433 and thus the portions of the microwave shields 37 in the cover-side recess 432 are continuously and electrically connected to the portion of the microwave shield 37 on the lid 433. The space in the wireless power transfer portion 420 is completely covered with six microwave shields 37. According to the configuration, the microwaves are less likely to leak out from the wireless power transfer portion 420.

Sixth Embodiment

Figure 19:
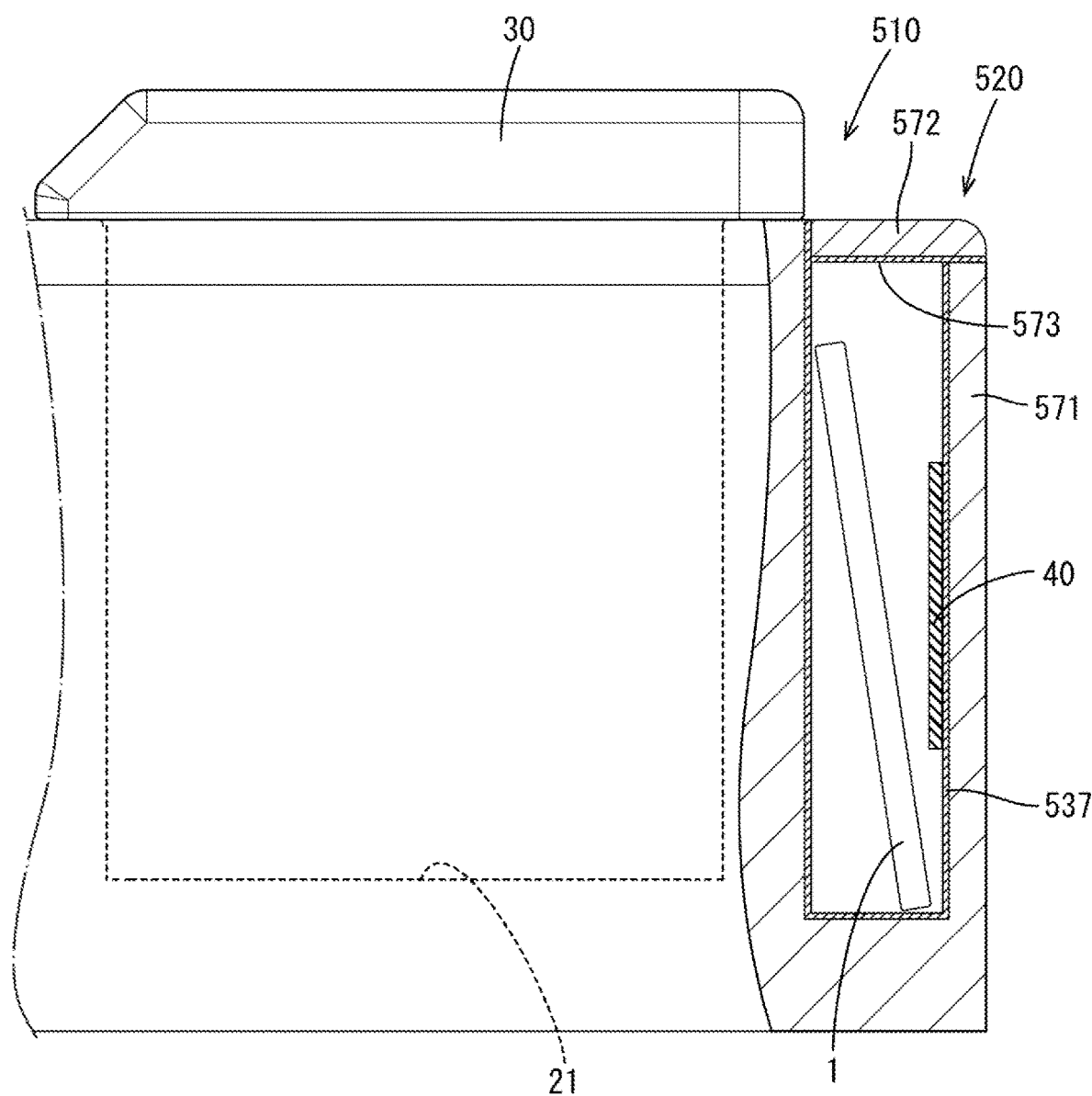
FIG. 19 is a conceptual cross-sectional view illustrating an electronic device disposed in a rear holder of a console according to the sixth embodiment.

A sixth embodiment will be described with reference to FIG. 19.

The sixth embodiment includes a wireless power transfer portion 520 (an example of the "holding portion") that is at a rear portion of a console 510 (an example of the "power transfer device"), which is a different from the console 10 in the first embodiment. The rear portion projects a rear end of the cover 30 that is attached to the console 510. Configurations, operations, functions, and effect similar to those of the first embodiment will not be described. Components and portions the same as those of the first embodiment will be indicated by reference symbols the same as the reference symbols that indicate the components and the portions of the first embodiment.

The wireless power transfer portion 520 in the sixth embodiment includes a small holding recess 571 and a small cover 572. The small holding recess 571 is elongated in the vertical direction to hold the electronic device 1. The small cover 572 is attached to an upper edge of the small holding recess 571.

The small holding recess 571 is recessed downward from an upper surface of the console 510 to open upward. Microwave shields 537 having a configuration similar to those in the first embodiment are attached to inner surfaces of walls of the small holding recess 571 with fixing means similar to that in the first embodiment. The power transfer panel 40 is attached to a surface of the microwave shield 537 attached to the inner surface of the rear wall of the small holding recess 571.

The small cover 572 is coupled to the edge of the small holding recess 571 with a hinge that is mounted to the rear portion of the console 510. The small cover 572 includes a lower surface to which a microwave shield 537 having a configuration similar to that in the first embodiment is attached with fixing means similar to that in the first embodiment.

When the small cover 572 is attached over the small holding recess 571, the small cover 572 close the opening of the small holding recess 571 so that the electronic device 1 held in the wireless power transfer portion 520 and surrounded by the microwave shields 537 from six directions.

The holding recess 21 in this embodiment can be used to hold articles that are not related to power transfer. The wireless power transfer portion 520 is included in the rear portion of the console 510 that is installed in the limited space of the vehicle C.

The sealing packing 27 and the switching mechanism 50 in the first embodiment are not included in this embodiment. However, a sealing packing or a switching mechanism may be added to this embodiment where appropriate.

When the small cover 572 is attached to the upper edge of the small holding recess 571, joints of the microwave shields 537 in the small holding recess 571 and the microwave shield 537 on the small cover 572 are continuously in electrical connection. Namely, portions of the microwave shields 537 in the small holding recess 571 contact portions of the microwave shield 537 on the small cover 572 and thus the portions of the microwave shield 537 in the small holding recess 571 are continuously and electrically connected to the portions of the microwave shield 537 on the cover 30. The space in the wireless power transfer portion 520 is completely covered with six microwave shields 537. According to the configuration, the microwaves are less likely to leak out from the wireless power transfer portion 520.

Seventh Embodiment

A seventh embodiment will be described with reference to FIG. 20.

The seventh embodiment includes a console 610 (an example of the "power transfer device"). The console 610 includes a wireless power transfer portion 620 (an example of the holding portion") that evenly transfers power to the electronic devices 1 held in the holding recess 21 by shifting a high intensity point at which the intensity of the microwaves is higher using a beamforming function.

In the wireless power transfer portion 620, the shape and the number of antennas are different from those of the antenna element 43 in the power transfer panel 40 in the first embodiment. The wireless power transfer portion 620 includes at least one antenna element 43 connected to the SG 12 via a phase shifter 80. Components and portions the same as those of the first embodiment will be indicated by reference symbols the same as the reference symbols that indicate the components and the portions of the first embodiment.

Figure 20:
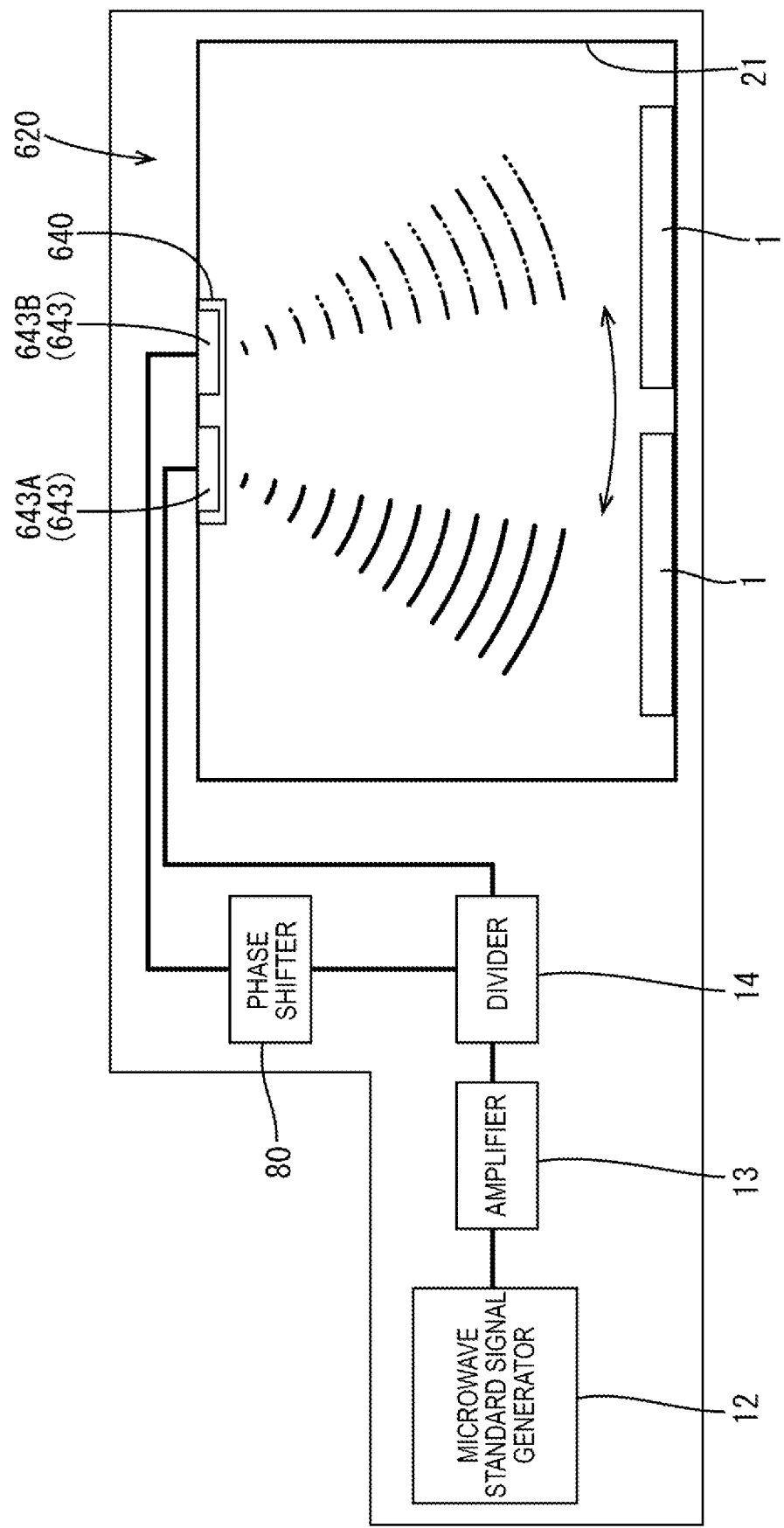
FIG. 20 is a schematic view illustrating shifting of a microwave target by a phase sifter in a console according to a seventh embodiment.

As illustrated in FIG. 20, the wireless power transfer portion 620 in the seventh embodiment includes a power transfer panel 640 (an example of the "power transfer component"). The wireless power transfer portion 620 includes two antenna elements 643 (an example of an "output portion") each having a rectangular shape. One of the antenna elements 643 connected to a divider 14 that divides the microwaves output from the amplifier 13 is defined as a first antenna element 643A. The other antenna element 643 connected to the divider 14 via the phase shifter 80 is defined as a second antenna element 643B.

The phase shifter 80 controls a phase of the microwaves from the second antenna element 643B. The phase shifter 80 controls the phase of the microwaves from the second antenna element 643B to match the phase of the microwaves from the first antenna element 643A at a specified point so that the intensity of the microwaves is increased at the specified point. The phase shifter 80 controls the phase of the microwaves from the second antenna element 643B to shift the high intensity point to a space in the holding recess 21 in which the electronic devices 1 are placeable.

In this embodiment, a high intensity region in which the intensity of the microwaves is higher may be shifted every unit time in the phase shifter 80. As a result, the electronic devices 1 in the holding recess 21 are evenly charged.

In general, when the intensity of the microwaves is increased at the specified point, leakage of the microwaves from the wireless power transfer portion 620 may occur. In this embodiment, the microwave shields 37 are attached to the walls of the holding recess 21 and the cover 30. Therefore, the electronic devices 1 are properly charged without the leakage of the microwaves from the wireless power transfer portion 620.

Eighth Embodiment

Figure 21:
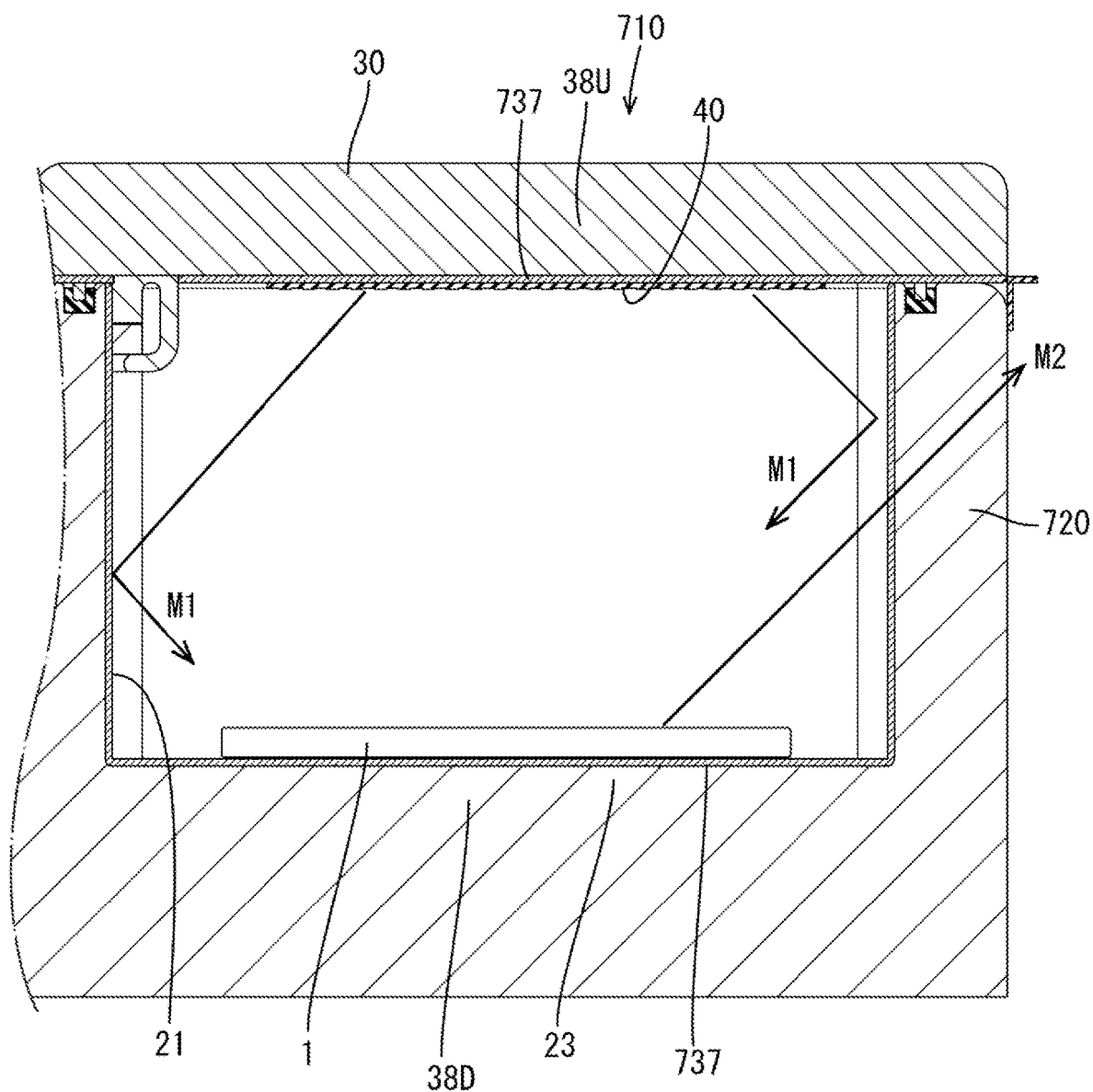
FIG. 21 is a schematic view illustrating an electrical configuration of a console according to an eighth embodiment.

An eight embodiment will be described with reference to FIG. 21.

The eighth embodiment includes a console 710 (an example of the "power transfer device") includes a wireless power transfer portion 720 (an example of the "holding portion"). The console 710 includes electromagnetic shields 737 (an example of the "shields") that are different from the microwave shields 37 in the wireless power transfer portion 20 in the first embodiment. The electromagnetic shields 737 shield specified frequencies. Configurations, operations, functions, and effect similar to those of the first embodiment will not be described. Components and portions the same as those of the first embodiment will be indicated by reference symbols the same as the reference symbols that indicate the components and the portions of the first embodiment.

The electromagnetic shields 737 in the wireless power transfer portion 720 in the eighth embodiment may be formed by printing microwave shielding layers on a sheet made of synthetic resin, fabric, or paper.

The electromagnetic shields 737 shields only specified microwaves by altering the shape of the microwave shielding layers. The electromagnetic shields 737 in this embodiment shield first microwaves M1 with a frequency range from 2.40 GHz to 2.45 GHz and pass second microwaves M2 with other frequency range.

The electromagnetic shields 737 may be ones described in "Ben A. Munk, Frequency Selective Surfaces: Theory and Design. New York, NJ John Wiley & Sons, Inc., 2000," "E. A. Parker, R. J. Langley, R. Cahill, J. C. Vardaxoglou "Frequency Selective Surfaces," IEE Proc., ICAP'83, Norwich, UK, 1, pp. 459-463, April 1983," or frequency selective electromagnetic shields manufactured by Mitsubishi Cable Industries, Ltd.

In this embodiment, the first microwaves M1 with the frequency range from 2.40 GHz to 2.45 GHz output from the power transfer panel 40 is shielded by the electromagnetic shields 737. However, the second microwaves M2 with the other frequency range (e.g., the mobile phone frequency range (800 MHz, 2 GHz, etc.)) pass through the electromagnetic shields 737. According to the configuration, the electronic devices 1 in the wireless power transfer portion 720 for the power transfer can communicate with external devices.

The electromagnetic shields 737 in this embodiment have weights less than weights of microwave shields formed from metal plates. The electromagnetic shields 737 can be provided with smaller thickness. In comparison to the microwave shields formed from the metal plates, the electromagnetic shields 737 are reduced in size.

Ninth Embodiment

A ninth embodiment will be described.

The ninth embodiment includes a console (an example of the "power transfer device") that includes a wireless power transfer portion (an example of the "holding portion") and the cover 30 of the wireless power transfer portion 220 in the third embodiment. The microwave reflector 137 attached to the cover 30 in the third embodiment is configured by an artificial magnetic conductor (AMC) in this embodiment. Configurations, operations, functions, and effect similar to those of the third embodiment will not be described.

The artificial magnetic conductor is a structure that has artificially imitated characteristics of a perfect magnetic conductor, that is, an artificial medium having characteristics to reflect incident electromagnetic waves with a phase rotation of 0° at a certain frequency. The AMC presents characteristics opposite the characteristics of a perfect electric conductor. If planar waves enter the AMC, the phase of the reflected waves is nor inverted, that is, equal to the phase of the planar waves (if the planar waves enter the perfect electric conductor, the phase of the reflected waves is inverted).

The AMC may be prepared by laminating the electromagnetic shield similar to that in the eighth embodiment and a conductive plate formed from a metal plate having conductivity. In the AMC having the perfect magnetic conductor characteristics, the phase of the reflected waves can be freely controlled. The AMC has an arbitrary reflection phase. With the AMC including an electromagnetic shield selected according to expected characteristics and parameters to have the expected characteristics, a reflecting surface is provided with the arbitrary reflection phase.

In this embodiment, the electromagnetic shield may shield microwaves with a frequency band of 2.4 GHz or 5 GHz and pass other microwaves. The metal of the conductive plate may be selected from any metals having conductivity such as copper and aluminum where appropriate.

In this embodiment, the AMC is attached to the cover 30. A distance between the cover 30 and the lower wall body 38D is reduced and the microwave concentration areas A20 similar to those in the third embodiment are present. Namely, the microwave concentration areas A20 including the higher microwave area A21 are provided while the wireless power transfer portion is reduced in size.

OTHER EMBODIMENTS

The technology disclosed herein is not limited to the embodiment and the modification that are illustrated in the above descriptions and drawings. Various embodiments such as the following embodiments may be included in the scope of the technology disclosed herein.

(1) In the above embodiments, the wireless power transfer portion 20 is included in the console 10. However, a wireless power transfer portion may be included in an armrest mounted to a seat in a vehicle or a door pocket in a vehicle.

(2) In the above embodiments, the power transfer panel 40 or 640 is attached to the inner surface 33 of the upper wall body 38U or the lower wall body 38D. However, a power transfer panel may be attached to an inner surface of a sidewall or power transfer panels may be attached to multiple walls.

(3) In the above embodiments, the cover 30 is configured as the upper section of the wireless power transfer portion 20. However, the cover 30 may be configured as a sidewall of a wireless power transfer portion.

(4) In the above embodiments, the cover 30 is pivotable. However, a cover that is a slidable may be used.

(5) In the above embodiments, the microwave shields 37 are attached to the surfaces of the sidewalls 24, the lower wall body 38D, and the upper wall body 38U. However, microwave shields may be embedded in walls and a cover. Alternatively, walls may be formed from microwave shields.

(6) In the above embodiments, the power transfer panel 40 includes two antenna elements 43. However, a power transfer panel may include three or more antenna elements to achieve multiple high intensity points.

EXPLANATION OF SYMBOLS

1: Electronic device
3: Built-in power receiver antenna (an example of a "power receiver")
10, 410, 510, 610, 710: Console (an example of a "power transfer device)
20, 120, 220, 320, 420, 520, 620, 720: Wireless power transfer portion (an example of a "holding portion")
23: Bottom wall (an example of "walls" and a "lower wall")
24: Sidewall (an example of the "walls")
27: Sealing packing (an example of a "sealing")
30, 430: Cover (an example of the "walls" and an "upper wall")
37, 537: Microwave shield (an example of "shields")
38D: Lower wall body (an example of a "lower wall")
38U: Upper wall body (an example of an "upper wall")
40, 640: Power transfer panel (an example of a "power transfer component")
50: Switching mechanism
60, 160, 260: Stand (an example of a "stand")
80: Phase shifter
137: Microwave reflector (an example of the "shields")
263: Partition (an example of a "stopper")
643: Antenna element (an example of "output portions")
643A: First antenna element (an example of the "output portions")
643B: Second antenna element (an example of the "output portions")
737: Electromagnetic shield (an example of the "shields")
A10: Microwave concentration area
A11: Higher microwave area (an example of a "microwave concentration area")
A12: Lower microwave area (an example of a "microwave concentration area")
A21: Higher microwave area (an example of a "microwave concentration area")
A22: Lower microwave area (an example of a "microwave concentration area")
C: Vehicle
F: Microwave traveling direction
T1: Communication antenna (an example of a "communication component")

The invention claimed is:

1. A power transfer device installed in a vehicle, the power transfer device comprising:
a power transfer component outputting microwaves receivable by a power receiver in at least one electronic device;
a holding portion including walls defining a holding space for holding the at least one electronic device and in which the power transfer component is disposed, wherein
the walls include shields to shield the microwaves, and
the power transfer component includes at least two output portions that output the microwaves; and
a phase shifter that controls a phase of the microwaves output from at least one of the output portions for increasing an intensity of the microwaves at a specified point, wherein
the phase shifter shifts a high intensity point at which the intensity of the microwaves is higher in a space in the holding portion in which the at least one electronic device is placeable by controlling the phase of the microwaves.

2. The power transfer device according to claim 1, wherein
the walls include a cover that is pivotable between a closed position to close an opening of the holding portion through which the at least one electronic device is inserted and an open position to uncover the opening, and
the power transfer device further comprises a switching mechanism to switch the power transfer component from off to on when the cover is pivoted to the closed position and from on to off when the cover is pivoted from the closed position to the open position.

3. The power transfer device according to claim 2, further comprising:
a sealing between an opening edge of the holding portion and the cover so that the sealing is brought in close contact with the opening edge of the holding portion and the cover to shield the microwaves when the cover is at the closed position.

4. The power transfer device according to claim 1, wherein
the walls include an upper wall included in an upper section of the holding portion or a lower wall included in a lower section of the holding portion, and
the power transfer component is attached to the upper wall or the lower wall.

5. The power transfer device according to claim 1, further comprising:
a communication component that establishes wireless communication with the at least one electronic device, wherein
the communication component is attached to one of the walls of the holding portion.

6. The power transfer device according to claim 1, wherein
the holding portion is configured to hold a plurality of electronic devices, and the holding portion includes a stopper to hold the plurality of electronic devices unaligned in a traveling direction in which the microwaves output from the power transfer component travel.

7. The power transfer device according to claim 1, wherein
the shields include an artificial magnetic conductor that reflects incident electromagnetic waves with a phase rotation of 0°.

8. The power transfer device according to claim 1, wherein
the shields are formed from an electromagnetic shielding material that shields predefined frequencies.

9. The power transfer device according to claim 1, wherein
the shields are microwave reflectors that reflect the microwaves,
a microwave concentration area in which the microwaves reflected by the microwave reflector are concentrated is formed in the holding portion, and
the holding portion includes a stand on which the at least one electronic device is placed in the microwave concentration area.

10. The power transfer device according to claim 9, wherein
the holding portion is configured to hold a plurality of electronic devices, and
the holding portion includes a stopper to arrange the plurality of electronic device in the microwave concentration area.

11. The power transfer device according to claim 10, wherein
the stopper holds the plurality of electronic devices unaligned in a traveling direction in which the microwaves output from the power transfer component travel.

12. The power transfer device according to claim 1, wherein
the holding portion is included in an armrest, a console, or a door pocket in the vehicle.

13. A power transfer device installed in a vehicle, the power transfer device comprising:
a power transfer component outputting microwaves receivable by a power receiver in at least one electronic device;
a holding portion including walls defining a holding space for holding the at least one electronic device and in which the power transfer component is disposed, wherein
the walls comprise: shields to shield the microwaves; and a cover that is pivotable between a closed position to close an opening of the holding portion through which the at least one electronic device is inserted and an open position to uncover the opening;
a communication component attached to one of the walls of the holding portion and that establishes wireless communication with the at least one electronic device;
a fitting groove that is formed with an opening edge of the opening of the holding portion;
a sealing disposed in the fitting groove, wherein
the sealing is brought in close contact with the opening edge of the holding portion and the cover to shield the microwaves when the cover is at the closed position.

* * * * *